United States Patent
Yu et al.

(10) Patent No.: US 10,497,619 B2
(45) Date of Patent: Dec. 3, 2019

(54) METHOD OF MANUFACTURING A SEMICONDUCTOR DEVICE INCLUDING THROUGH SILICON PLUGS

(71) Applicant: Taiwan Semiconductor Manufacturing Company, Ltd., Hsinchu (TW)

(72) Inventors: Chen-Hua Yu, Hsinchu (TW); Chia-Lin Yu, Tainan County (TW); Hung-Pin Chang, Taipei County (TW); Chien Ling Hwang, Hsinchu (TW); Jui-Pin Hung, Hsinchu (TW); Yung-Chi Lin, Taipei County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/100,603

(22) Filed: Aug. 10, 2018

(65) Prior Publication Data
US 2018/0350678 A1 Dec. 6, 2018

Related U.S. Application Data

(63) Continuation of application No. 15/069,474, filed on Mar. 14, 2016, now Pat. No. 10,049,931, which is a
(Continued)

(51) Int. Cl.
*H01L 21/768* (2006.01)
*H01L 23/48* (2006.01)
(Continued)

(52) U.S. Cl.
CPC .... *H01L 21/76898* (2013.01); *H01L 21/3065* (2013.01); *H01L 21/6835* (2013.01);
(Continued)

(58) Field of Classification Search
CPC .............. H01L 21/486; H01L 23/481; H01L 23/49827
See application file for complete search history.

(56) References Cited

U.S. PATENT DOCUMENTS

| | | |
|---|---|---|
| 4,074,342 A | 2/1978 | Honn et al. |
| 5,391,917 A | 2/1995 | Gilmour et al. |

(Continued)

FOREIGN PATENT DOCUMENTS

| | | |
|---|---|---|
| CN | 100433391 | 11/2008 |
| CN | 101577304 | 11/2009 |

(Continued)

OTHER PUBLICATIONS

Office Action dated Jun. 4, 2012 from corresponding application No. CN201110038181.3.
(Continued)

*Primary Examiner* — Matthew E Warren
(74) *Attorney, Agent, or Firm* — Haynes and Boone, LLP

(57) ABSTRACT

A method of making a semiconductor device is provided including forming a first opening and a second opening in a first surface of a substrate. A conductive material is formed in the first opening and in the second opening and over the first surface in the first region of the substrate between the openings. A thickness of the substrate may be reduced from a second surface of the substrate, opposite the first surface, to a third surface opposite the first surface which exposes the conductive material in the first opening and the conductive material in the second opening. A light emitting diode (LED) device is connected to the third surface of the substrate.

20 Claims, 22 Drawing Sheets

Related U.S. Application Data continuation of application No. 13/942,112, filed on Jul. 15, 2013, now Pat. No. 9,287,440, which is a continuation of application No. 12/879,584, filed on Sep. 10, 2010, now Pat. No. 8,507,940.

(60) Provisional application No. 61/320,819, filed on Apr. 5, 2010.

(51) Int. Cl.
*H01L 21/48* (2006.01)
*H01L 23/498* (2006.01)
*H01L 33/64* (2010.01)
*H01L 21/683* (2006.01)
*H01L 33/48* (2010.01)
*H01L 33/62* (2010.01)
*H01L 33/00* (2010.01)
*H01L 21/3065* (2006.01)
*H01L 23/14* (2006.01)
*H01L 23/00* (2006.01)

(52) U.S. Cl.
CPC .. *H01L 21/76876* (2013.01); *H01L 21/76877* (2013.01); *H01L 21/76879* (2013.01); *H01L 23/481* (2013.01); *H01L 33/005* (2013.01); *H01L 33/0054* (2013.01); *H01L 33/486* (2013.01); *H01L 33/62* (2013.01); *H01L 33/641* (2013.01); *H01L 33/644* (2013.01); *H01L 33/647* (2013.01); *H01L 21/486* (2013.01); *H01L 21/76843* (2013.01); *H01L 23/147* (2013.01); *H01L 23/49827* (2013.01); *H01L 24/29* (2013.01); *H01L 24/48* (2013.01); *H01L 24/49* (2013.01); *H01L 24/97* (2013.01); *H01L 2221/68345* (2013.01); *H01L 2221/68359* (2013.01); *H01L 2224/16* (2013.01); *H01L 2224/32225* (2013.01); *H01L 2224/32506* (2013.01); *H01L 2224/48091* (2013.01); *H01L 2224/48227* (2013.01); *H01L 2224/48233* (2013.01); *H01L 2224/49113* (2013.01); *H01L 2224/73265* (2013.01); *H01L 2224/97* (2013.01); *H01L 2924/00012* (2013.01); *H01L 2924/00014* (2013.01); *H01L 2924/01019* (2013.01); *H01L 2924/01029* (2013.01); *H01L 2924/01078* (2013.01); *H01L 2924/01079* (2013.01); *H01L 2924/01322* (2013.01); *H01L 2924/04941* (2013.01); *H01L 2924/12041* (2013.01); *H01L 2924/14* (2013.01); *H01L 2924/181* (2013.01); *H01L 2924/19041* (2013.01); *H01L 2924/3512* (2013.01); *H01L 2933/0066* (2013.01)

(56) References Cited

U.S. PATENT DOCUMENTS

| | | | |
|---|---|---|---|
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,198,225 B1 | 3/2001 | Kano et al. | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,531,328 B1 | 3/2003 | Chen | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,582,496 B2 | 9/2009 | Lee et al. | |
| 7,855,397 B2 | 12/2010 | Alley et al. | |
| 8,174,044 B2 | 5/2012 | Wu et al. | |
| 8,441,020 B2 | 5/2013 | Greenwood et al. | |
| 8,823,021 B2 | 9/2014 | Kirihara et al. | |
| 2006/0131732 A1 | 6/2006 | Nah et al. | |
| 2007/0108461 A1 | 5/2007 | Shiraishi et al. | |
| 2008/0043444 A1 | 2/2008 | Hasegawa et al. | |
| 2009/0273002 A1* | 11/2009 | Chiou | H01L 33/486 257/99 |
| 2010/0108893 A1* | 5/2010 | Flitsch | H01L 27/1463 250/361 R |
| 2010/0127299 A1 | 5/2010 | Smith et al. | |
| 2010/0140790 A1 | 6/2010 | Setiadi et al. | |
| 2011/0031509 A1* | 2/2011 | Kirihara | H01L 24/97 257/81 |
| 2011/0169042 A1* | 7/2011 | Wu | H01L 33/642 257/99 |
| 2011/0215360 A1 | 9/2011 | Wang | |

FOREIGN PATENT DOCUMENTS

| | | |
|---|---|---|
| JP | 2008034748 | 2/2008 |
| TW | 200620710 | 6/2006 |
| TW | 2009155505 | 4/2009 |
| TW | 201028605 | 8/2010 |

OTHER PUBLICATIONS

Office Action dated Aug. 7, 2012 from corresponding application No. JP2011082089.
Office Action dated Feb. 5, 2013 from corresponding application No. JP2011082089.
Office Action dated Sep. 24, 2013 from corresponding application No. KR 10-2011-00212, w/ English translation.
Office Action dated Jul. 30 from corresponding application No. TW 100102608.

* cited by examiner

METHOD OF MANUFACTURING A SEMICONDUCTOR DEVICE INCLUDING THROUGH SILICON PLUGS

CLAIM OF PRIORITY

The present application is a continuation of U.S. application Ser. No. 15/069,474, filed Mar. 14, 2016, which is a continuation of U.S. application Ser. No. 13/942,112, entitled "METHOD OF MANUFACTURING A SEMICONDUCTOR DEVICE INCLUDING THROUGH SILICON PLUGS", filed on Jul. 15, 2013, which is a continuation of Ser. No. 12/879,584, entitled "HEAT DISSIPATION BY THROUGH SILICON PLUGS," filed on Sep. 10, 2010, now U.S. Pat. No. 8,507,940, which claims the priority from U.S. Provisional application No. 61/320,819, entitled "NOVEL SEMICONDUCTOR PACKAGE WITH THROUGH SILICON VIAS," filed on Apr. 5, 2010, all of which are incorporated herein by reference in their entireties.

RELATED APPLICATIONS

The present application is related to U.S. application Ser. No. 12/329,138, entitled "METHOD FOR PRODUCING STACKABLE DIES," filed on Dec. 5, 2008, which is incorporated herein by reference in its entirety.

BACKGROUND

The trend in advanced semiconductor packaging has been to reduce the form factor while improving electrical performance. This enables products for industry and consumers that are faster, cheaper and smaller. Through silicon vias (TSVs), or more accurately through silicon plugs (TSPs), provide an approach to achieve higher levels of integration and form factor reduction for advanced semiconductor packaging. As the name implies, the electrical connection of the back and front of a semiconductor device enables the possibility of vertically assembling multiple chips in a package where previously only one chip was present. Accordingly, more semiconductor devices can be integrated into a smaller form factor. In addition, different types of semiconductor chips can also be integrated in a single package to create a so-called system in a package (SIP). Irrespective of the approach, the footprint of multiple packages in the printed circuit board is reduced which also reduces final product cost. Finally, interconnecting the chips by using TSVs can decrease the number of electrical connections necessary to the substrate (i.e., unit), because one substrate connection can service multiple chips. This also helps to simplify the assembly process and improve yield. In addition, through silicon vias provide a superior heat dissipation mechanism.

Interest in using light-emitting diodes (LEDs) as lighting devices has significantly increased in recent years due to LEDs' high light output efficiency. However, heat is generated from the PN junctions of LEDs by electrical energy that is not converted into useful light. If the heat is not removed, the LEDs run at high temperatures, which not only lower their efficiency, but also make the LEDs more dangerous and less reliable. Therefore, thermal management of LEDs is very important.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1A:
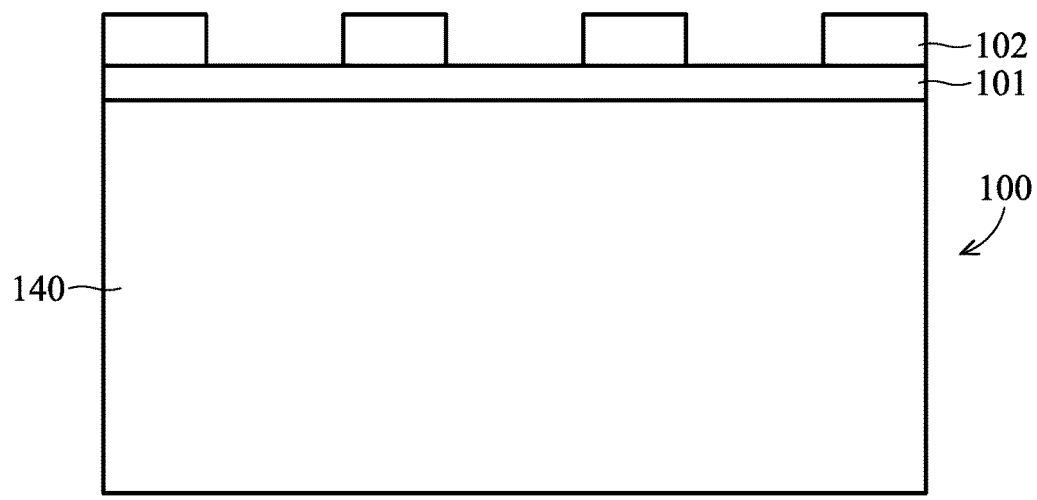
FIGS. 1A-18 illustrate structures and intermediate stages in a process flow for creating a package for a semiconductor die, in accordance with some embodiments.

It is to be understood that the following disclosure provides many different embodiments, or examples, for implementing different features of the present disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIGS. 1A-18 show cross-sectional views of intermediate stages in the making of some embodiments of this disclosure. FIG. 1A shows a first substrate 100 with a photoresist pattern, in accordance with some embodiments of this disclosure. The first substrate 100 may comprise, for example, bulk silicon, doped or undoped, or an active layer of a semiconductor-on-insulator (SOI) substrate. Generally an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substances, such as multi-layered or gradient substrates may also be used.

In the example described here, the first substrate 100 is made of a silicon material 140. There is a dielectric layer 101 deposited over the silicon material 140. A photoresist layer 102 is then deposited over the dielectric layer 101 and the photoresist layer 102 is patterned with openings, such as openings of through silicon vias. The dielectric layer 101 is a sacrificial layer used to protect substrate surface during the etching process of through silicon vias.

Figure 1B:
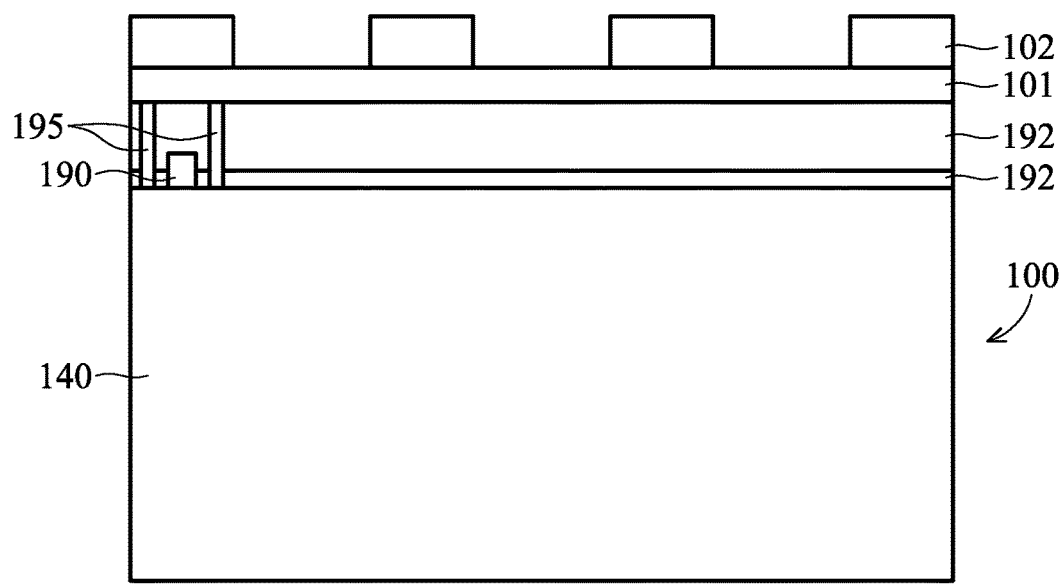

In some embodiments, the first substrate 100 already has an electrical circuitry 190 built in, as shown in FIG. 1B, before the photoresist layer 102 is deposited and patterned. FIG. 1B shows that the electrical circuitry 190 has been formed on the first substrate 100. The electrical circuitry 190 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the electrical circuitry 190 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present disclosure and are not meant to limit the present disclosure in any manner. Other circuitry may be used as appropriate for a given application.

Also shown in FIG. 1B are an etch stop layer 191 and an inter-layer dielectric (ILD) layer 192. In some embodiments, the etch stop layer 191 is preferably formed of a dielectric material having a different etch selectivity from adjacent layers, e.g., the underlying first substrate 110 and the overlying ILD layer 192. In an embodiment, the etch stop layer 191 may be formed of SiN, SiCN, SiCO, CN, combinations thereof, or the like deposited by chemical vapor deposition (CVD) or plasma-enhanced CVD (PECVD) techniques.

The ILD layer 192 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method, such as spinning, CVD, and PECVD. It should also be noted that the etch stop layer 191 and the ILD layer 192 may each comprise a plurality of dielectric layers, with or without an etch stop layer formed between adjacent dielectric layers.

Contacts 195 are formed through the ILD layer 192 to provide an electrical contact to the electrical circuitry 190. The contacts 195 may be formed, for example, by using photolithography techniques to deposit and pattern a photoresist material on the ILD layer 192 to expose portions of the ILD layer 192 that are to become the contacts 195. An etch process, such as an anisotropic dry etch process, may be used to create openings in the ILD layer 192. The openings are, preferably, lined with a diffusion barrier layer and/or an adhesion layer (not shown), and filled with a conductive material. Preferably, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 195 as illustrated in FIG. 1B.

Figure 2:
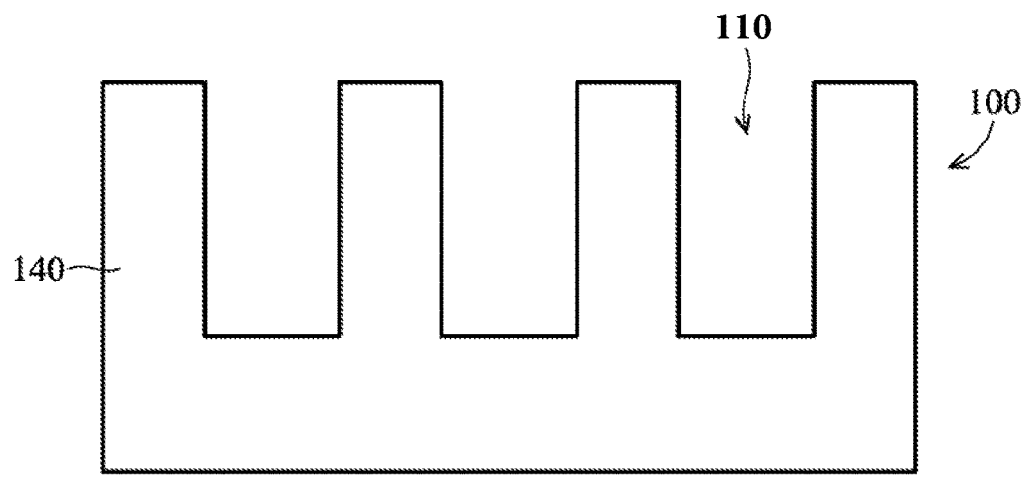

FIG. 2 shows first substrate 100 after the openings have been etched, in accordance with some embodiments. Although FIG. 2 does not show the electrical circuitry 190, contact plugs 195, and dielectric layers 191 and 192 of FIG. 1B, such features can exist in FIG. 2 and the figures following FIG. 2. In an embodiment, a timed etching process, such as an anisotropic dry etch process, is performed until a desired depth for the openings 110 is obtained in the first substrate 100. It should be understood that the etch processes described herein may be accomplished in single etch processes or multiple etch processes. The etching process(es) can be a dry process or a wet process.

In some embodiments, the depths of openings may range from about 20 µm to about 200 µm. In some embodiments, the widths of openings may range from about 5 µm to about 100 µm. In some embodiments, the openings 110 are through silicon vias (or trenches). Etching openings with such depths by purely relying on the photoresist layer 102 could be hampered by the physical limitations of the process. In the embodiments shown here, the dielectric layer 101 is first etched and then used as a patterning mask. The material for the dielectric layer 101 can be any dielectric material, such as silicon dioxide, silicon nitride, or a combination of both films. One example of a material for the dielectric layer 101 is silicon oxide deposited by plasma enhanced chemical vapor deposition (PECVD) using TEOS (Tetraethyl orthosilicate) as the silicon source. PECVD silane oxide film can also be used. In some embodiments, the TEOS oxide has a thickness between about 500 Å to about 10000 Å. The dielectric layer 101 does not need to be deposited by PECVD. The dielectric layer 101 can be a spin-on dielectric (SOD) or a spin-on glass (SOG). The dielectric layer 101 can also be deposited (or grown) by a thermal process, such as a thermally grown silicon dioxide, or an oxide film deposited by thermal CVD.

Figure 3:
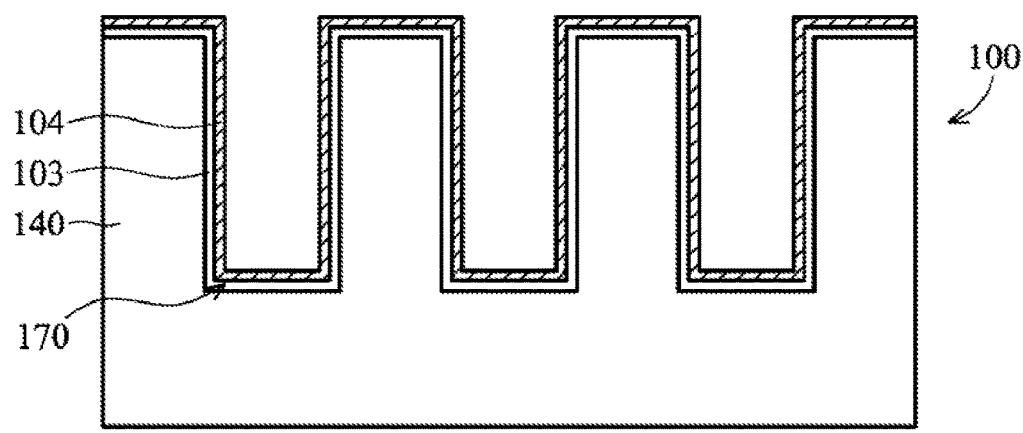

After the through silicon vias have been etched, the photoresist and the sacrificial dielectric layer 101 are both removed. After the openings, such as opening 110, are created, the openings are filled. FIG. 3 shows that the substrate is first lined with an isolation layer 103 and a barrier/Cu-seed layer 104, in accordance with some embodiments. The isolation layer 103 is made of a dielectric material, such as oxide, nitride, or a combination of both. One example of a material for the isolation layer 101 is silicon oxide deposited by plasma enhanced chemical vapor deposition (PECVD) using silane or TEOS as the silicon source. In some embodiments, the isolation layer has a thickness between about 500 Å to about 15000 Å. The isolation layer 103 can also be deposited (or grown) by a thermal process, such as a thermally grown oxide, or a thermal CVD oxide. Alternatively, the dielectric isolation layer 103 can be a doped film, using dopants such as phosphorus (P) or boron (B) and phosphorus (P). The phosphorus (P) in the PSG (phosphorus silicon glass) or BPSG (boron phosphorus silicon glass) film can getter copper, which is used to fill the openings, which are through silicon vias (or trenches) in this example. Copper can diffuse into the silicon substrate. Although the through silicon vias are lined with a barrier layer, which will be described later, the barrier coverage could be insufficient on the sidewalls near the bottom of the vias, such as at corner 170. Using PSG or BPSG as the isolation layer 103 can provide extra protection against copper diffusion.

Dielectric layer 103 has higher thermal resistance than silicon. Table I compares the simulation results for the thermal resistance of silicon substrate with an oxide dielectric layer of varying thicknesses.

TABLE I

Comparison of thermal resistance for various silicon/oxide thicknesses.

| Si/Oxide (µm/µm) | Thermal Resistance (K/Watt) |
|---|---|
| 100/0 | 1.81 |
| 100/1.5 | 6.37 |
| 50/0 | 0.92 |
| 50/1.5 | 5.95 |

The data in Table I show that oxide could significantly increase the thermal resistance. Therefore, the thickness of dielectric layers in the package should be kept to a minimum.

After the isolation layer 103 is deposited, a barrier/Cu-seed layer 104 is deposited. The barrier/Cu-seed layer 104 includes at least two sub-layers, a barrier layer and a copper seed layer. The barrier layer is made of one or more copper barrier materials, such as Ta, TaN, Ti, TiN, CoW, or the like. The barrier layer provides protection against copper diffusing into the silicon substrate 100. The barrier layer can be deposited by PVD (physical vapor deposition), chemical vapor deposition (CVD), atomic layer deposition (ALD), or other methods. After the deposition of the barrier layer, a copper seed layer is deposited. Similarly, the copper seed layer can be deposited by PVD (physical vapor deposition), chemical vapor deposition (CVD), atomic layer deposition (ALD), or other methods. In some embodiments, the barrier/Cu-seed layer 104 is made of TaN/Ta barrier and a copper seed layer. The barrier layer 104 in this embodiment is made of two sub layers, a TaN layer and a Ta layer. In some embodiments, TaN, Ta and Cu seed are all deposited by PVD, and the deposition of TaN, Ta, and Cu seed are all conducted in one single PVD chamber with different targets and sputtering gases. In some embodiments, each thickness of TaN and Ta is between about 100 Å to about 2000 Å, and the thickness of the copper seed layer is between about 1000 Å to about 15000 Å.

Figure 4:
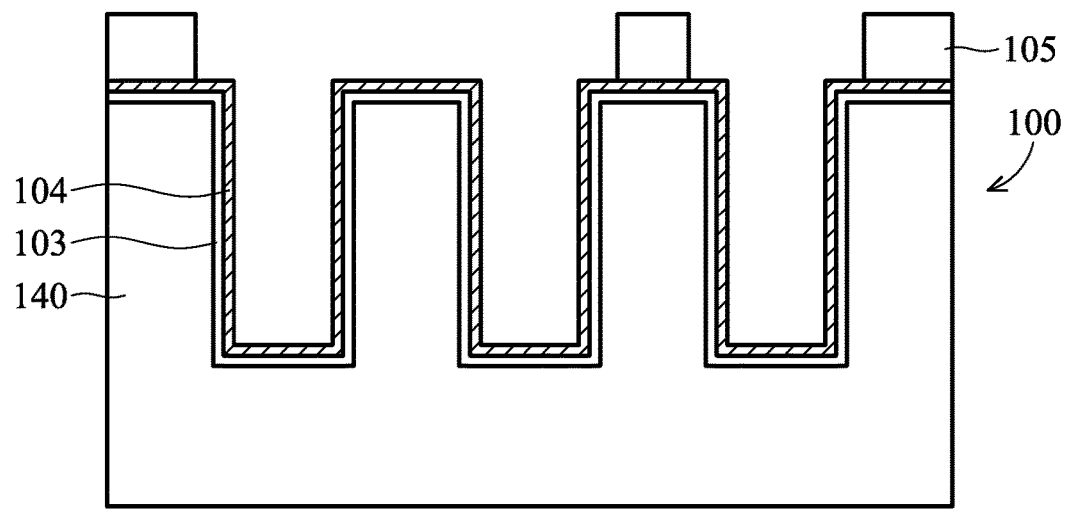

After the deposition of the barrier/copper-seed layer 104, the substrate is patterned to define areas to receive copper plating. FIG. 4 shows a patterned photoresist layer 105 being formed on the first substrate 100, in accordance with some embodiments. In some embodiments, the patterned photo-layer 105 is made of conventional photoresist, which is in liquid form and is deposited by a spin-on process. In another embodiment, the material of the patterned photo-layer 105 is a dry film resist (DFR), which can also be patterned by photolithography (i.e., with light exposure). The DFR can be a positive or a negative photoresist. DFR has been used for creating patterns for copper plating for circuit boards. An example of DFR is MP 112, made by TOK CO. LTD. of Japan. After the DFR is laminated on the first substrate 100 (or over layer 104), the DFR is exposed with a pattern that defines areas on the substrate surface that would receive copper plating. Using dry film resist has an advantage over the wet spin-on photoresist in that the dry film resist is only laminated on the substrate surface. In contrast, wet spin-on photoresist would flow into the openings, such as opening 110. Since the openings for through silicon vias (or trenches) are quite deep, as mentioned above between about 20 μm to about 200 μm, the wet photoresist filled inside could be hard to removed completely for copper to be properly plated on the sidewalls and bottom surfaces of the openings.

Figure 5:
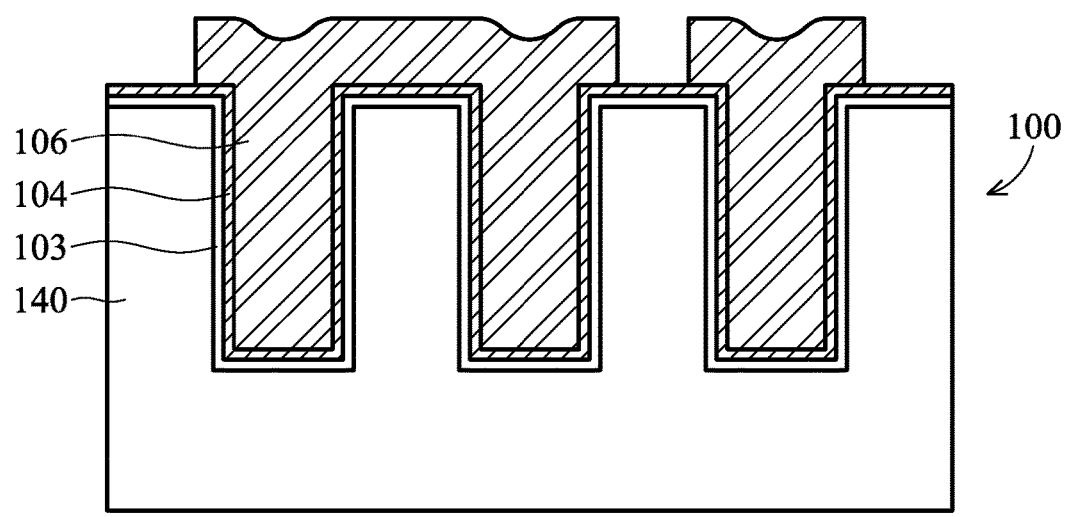

FIG. 5 shows a copper film 106 being plated on the first substrate 100 and the DRF being stripped from the substrate surface after copper plating, in accordance with some embodiments. Electrical copper plating (ECP) processes or electroless copper plating process used in the metal interconnects of semiconductor device manufacturing can be used. In some embodiments, the thickness of the copper film 106 is less than about 30 μm. In other embodiments, the thickness of the copper film 106 is less than about 20 μm. In yet some other embodiments, the thickness of the copper film 106 is less than about 10 μm. A copper film that is too thick could result in substrate warping. In some embodiments, the copper film 106 is deposited to only fill the openings (or through silicon vias), such as opening 110 shown in FIG. 4. In another embodiment, the copper film 106 is deposited not only to fill the (through silicon via) openings, but also to provide landing pads for packaged devices on a substrate, such as a PCB (printed circuit board), or to receive semiconductor chips.

In some embodiments, the thickness of film 106 is between about 10 μm to about 30 μm. After copper film 106 is plated, the photo-layer 105 is removed. Both wet spin-on photoresist and dry film resist can be removed by an ashing process, which is typically followed by a wet clean to completely remove the impurities on the substrate surface.

Figure 6:
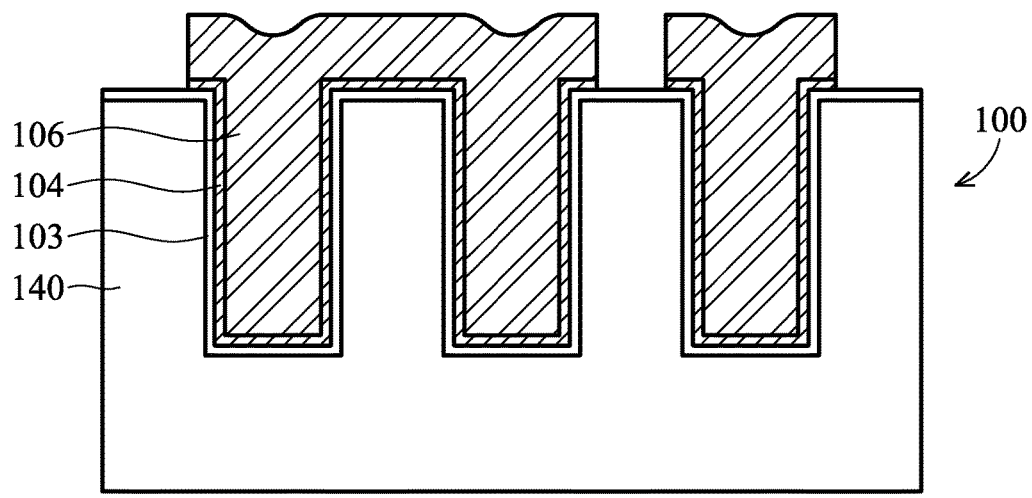
Figure 7:
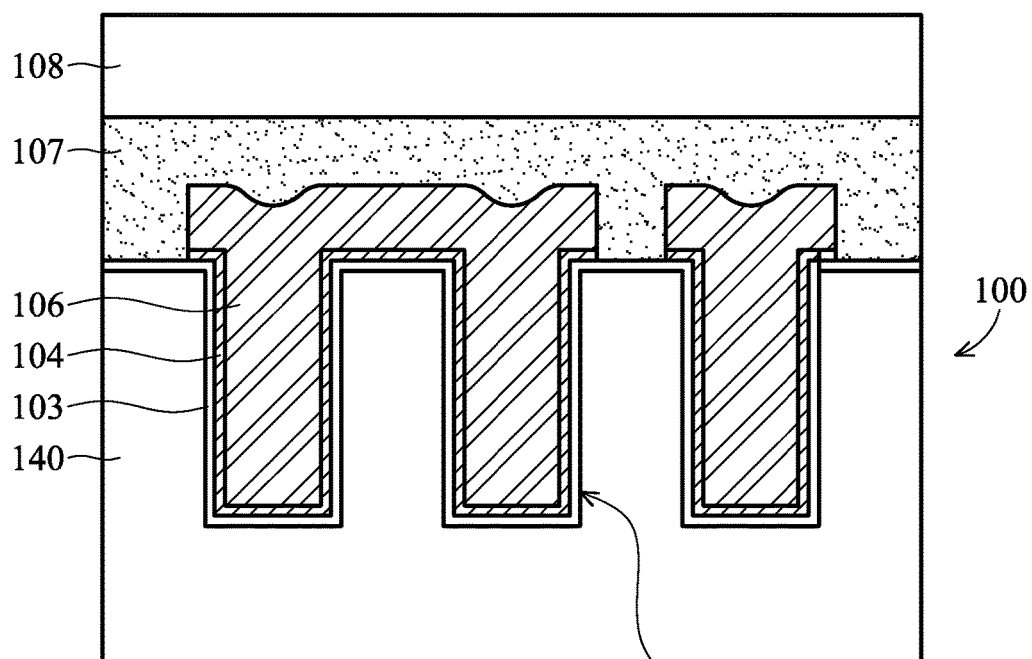

After copper plating and resist removal, the barrier/Cu-seed layer 104 in the areas that do not receive copper plating is removed, as shown in FIG. 6 in accordance with some embodiments. Following the previous operation, the front of the substrate is glued to a second substrate 108 as shown in FIG. 7. The second substrate 108 is a dummy substrate and can be made of a dielectric material, such as glass. Alternatively, the second substrate 108 can be made of a conductive material, such as metal. FIG. 7 shows that substrate 100 is glued to the second substrate 108 with a glue layer 107, in accordance with some embodiments. The material used for the glue layer 107 should allow for easy removal when the dummy substrate 108 is no longer needed. In some embodiments, the material for the glue layer 107 is an epoxy polymer. The glue layer 107 is first applied on the first substrate 100 in liquid form. After the second substrate 108 is placed over the glue layer 107, the glue layer can be left to dry or be heated at a low temperature. After drying and heating (or curing), substrate 100 is firmly attached to dummy substrate 108.

Figure 8:
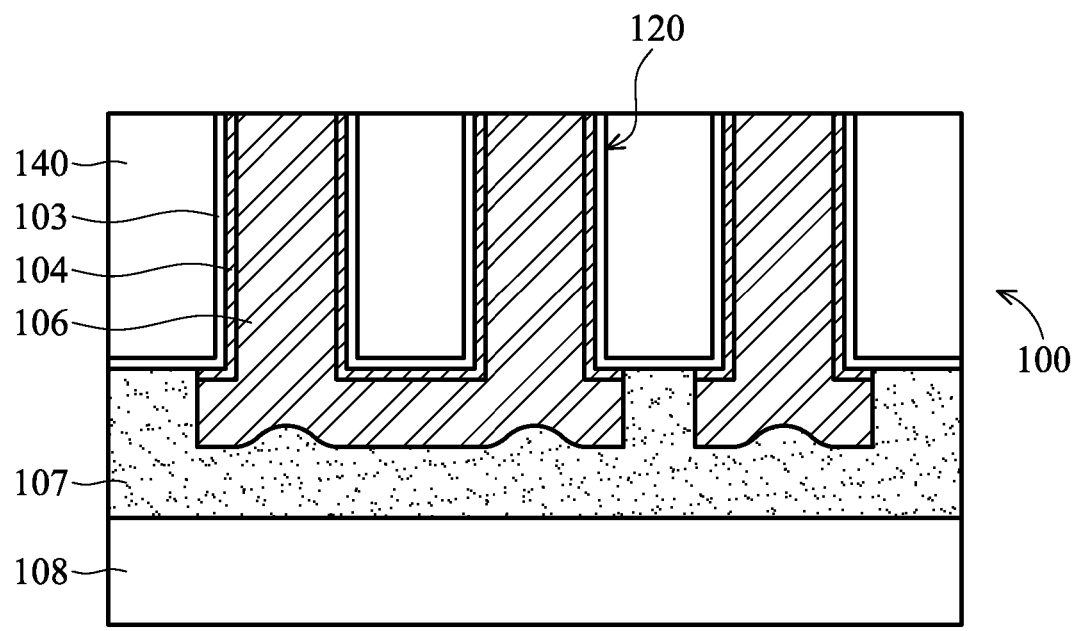

Afterwards, first substrate 100 undergoes backside grinding to remove excess silicon to expose the through silicon vias 120. In some embodiments, backside grinding is followed by chemical mechanical polishing (CMP) processing to smooth the substrate surface that has undergone grinding. FIG. 8 shows the first substrate 100 after the backside silicon has been removed to expose the through silicon vias 120, in accordance with some embodiments. In some embodiments, the silicon removal process is a grinding process. A grinding wheel is commonly used in packaging processes to remove excess silicon from silicon substrate. The grinding is performed until the isolation layer 103 and barrier/Cu-seed layer 104 are completely removed from the bottoms of through silicon vias 120.

Reducing the thickness of silicon substrate can improve heat dissipation efficiency of silicon substrate. Table II compares the simulation results for the thermal resistance of silicon substrates with varying thicknesses.

TABLE II

Comparison of thermal resistance for silicon substrates with varying thicknesses.

| Thickness (μm) | Thermal Resistance (K/Watt) |
| --- | --- |
| 500 | 4.82 |
| 200 | 3.18 |
| 100 | 1.81 |
| 50 | 0.92 |

The data show that the thermal resistance is greatly reduced when the substrate thickness is reduced to 100 μm. The thinner silicon thickness provides extra heat dissipation in addition to the heat dissipation provided by the copper in the through silicon vias (or trenches).

Figure 9:
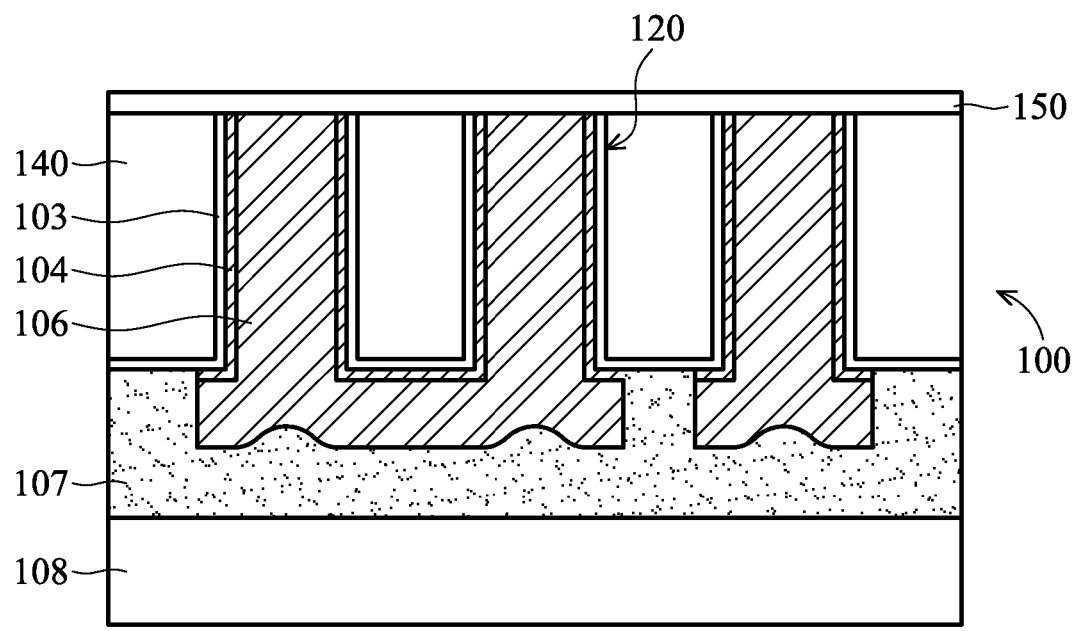

After backside grinding, the backside of first substrate 100 is deposited with a dielectric layer 150, as shown in FIG. 9 in accordance with some embodiments. Similar to isolation layer 103, dielectric layer 150 can be made of oxide, nitride, or a combination of both. One example of a material for the dielectric layer 150 is silicon oxide deposited by plasma enhanced chemical vapor deposition (PECVD) using silane as the silicon source. In some embodiments, the isolation layer has a thickness between about 5000 Å to about 20000 Å. In some embodiments, the dielectric layer 150 is a doped film, using dopants such as phosphorus (P) or boron (B) and phosphorus (P). As mentioned above, the phosphorus (P) in the PSG or BPSG film can getter copper.

Figure 10:
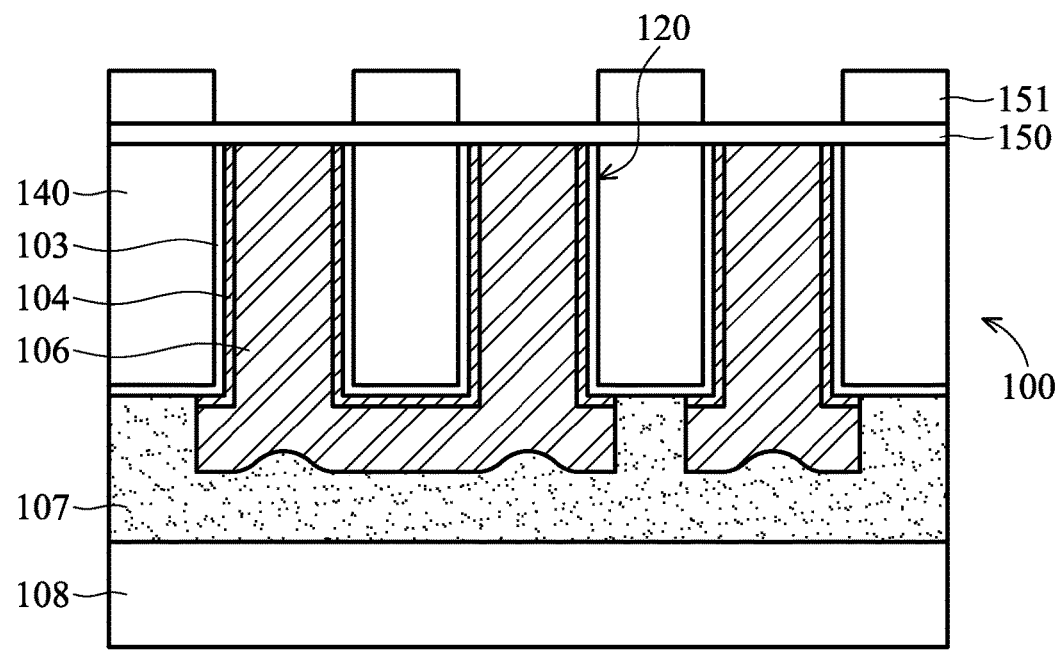
Figure 11:
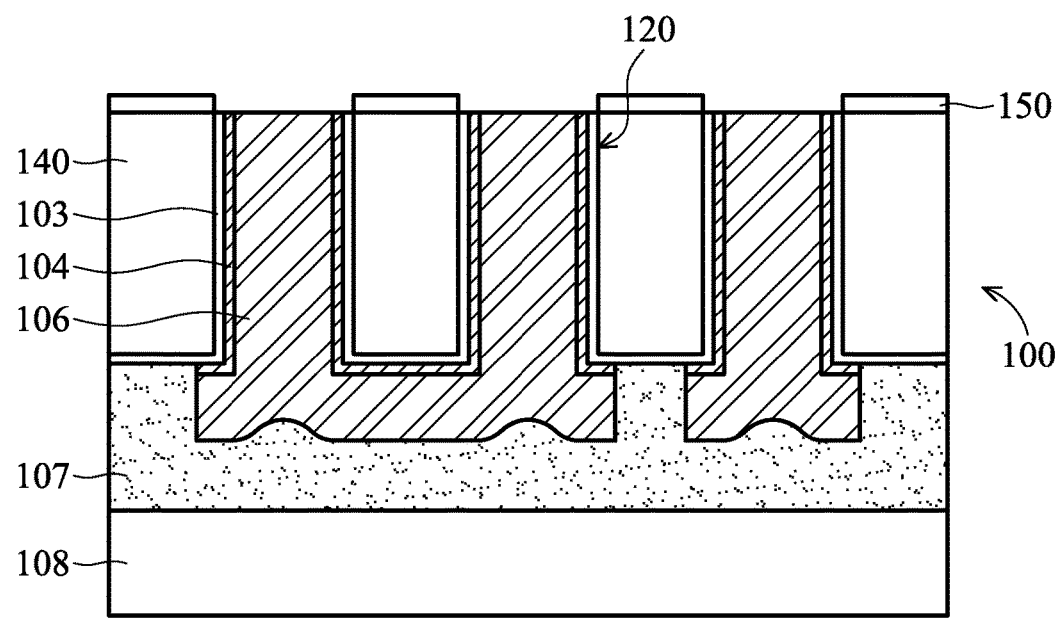

Following the deposition of dielectric layer 150, the substrate is deposited and patterned with a photoresist layer 151, as shown in FIG. 10 in accordance with some embodiments. The photoresist layer 151 can be deposited with a spin-on resist (wet) or a dry film resist. The pattern opens at the areas of through contact vias (or trenches) in order to remove the dielectric layer 150 of those areas. After the photoresist pattern is formed, the dielectric layer 150 exposed by the pattern is removed by etching. Dielectric etching processes used in semiconductor chip manufacturing can be used to achieve the removal purpose. The etching processes can be dry processes or wet processes. FIG. 11 shows the first substrate 100 and the second substrate 108 after the dielectric layer 150 in the open areas is etched, in accordance with some embodiments.

Figure 12:
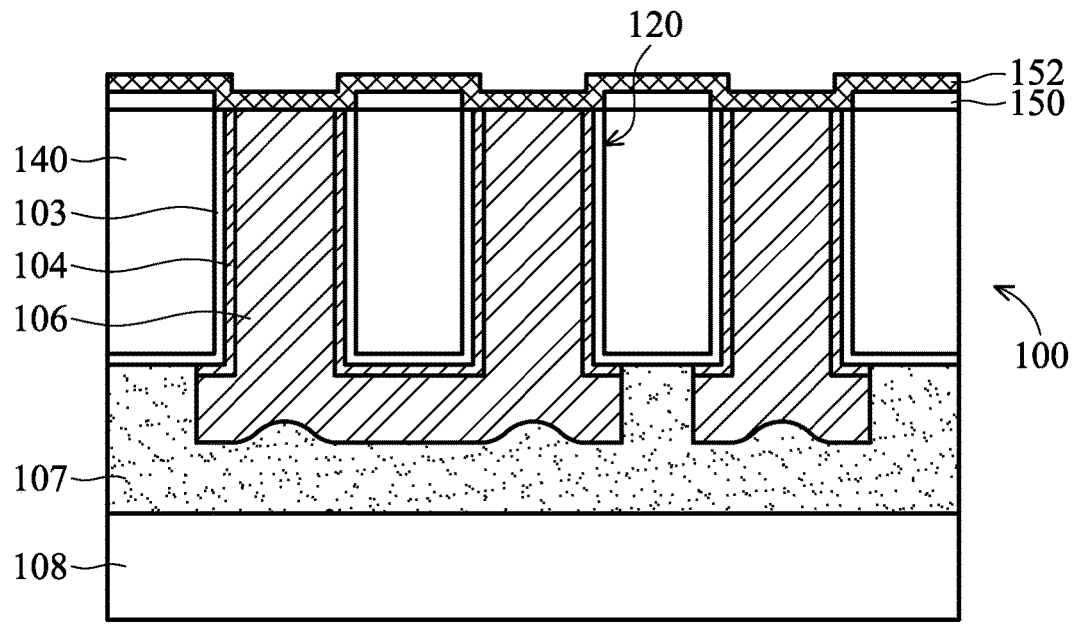

Afterwards, a barrier/Cu-seed layer 152 is deposited as shown in FIG. 12, in accordance with some embodiments. The barrier/Cu-seed is a composite layer of a barrier layer and a copper seed layer. The barrier layer protects the Si substrate from diffused copper. As mentioned above, Ta, TaN, Ti, TiN, CoW, or a combination of the above-mentioned films can be used as barrier. In some embodiments, the barrier material is Ti and a thickness between about 500 Å to about 5000 Å is deposited. A thin copper seed layer is deposited with a thickness between about 1000 Å to about 10000 Å. The deposition methods that can be used to deposit the barrier layer and copper seed layer have been mentioned above.

Figure 13:
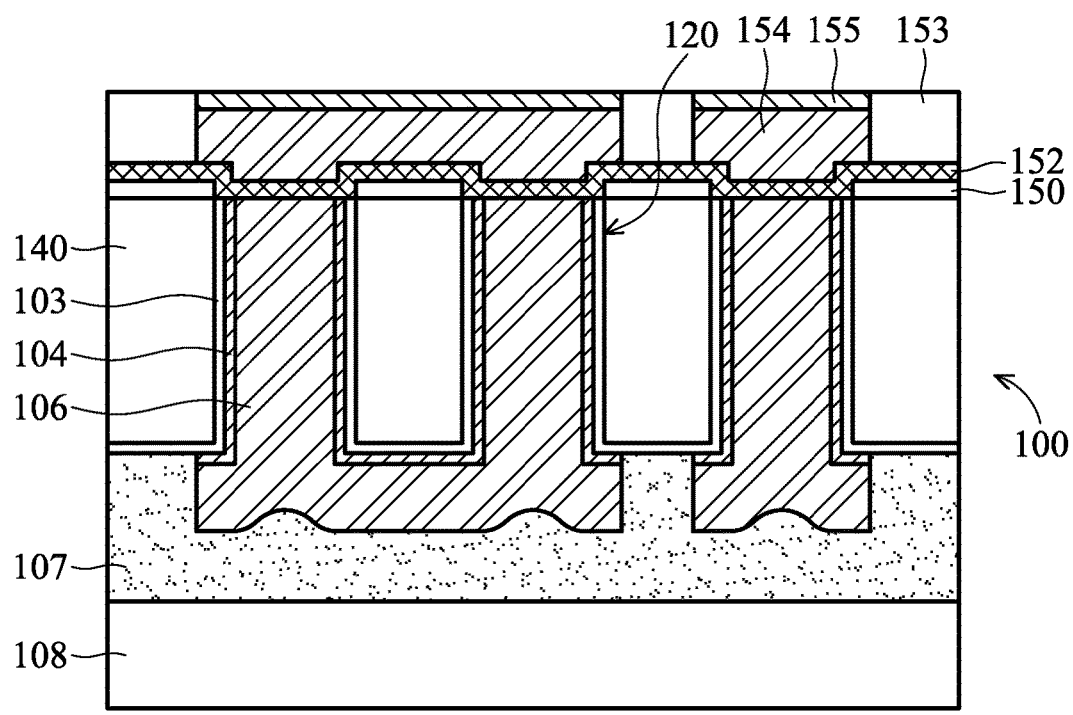

After the deposition of the barrier/Cu-seed layer 152, the substrate is patterned with a photoresist layer 153 to define regions receiving copper plating, as shown in FIG. 13 in accordance with some embodiments. As mentioned above, the photoresist can be a spin-on resist (wet) or a DFR. After resist patterning, a copper layer 154 is first plated on the exposed areas (not covered by the photoresist) of the substrate. As mentioned above, the plating process for copper layer 154 can be an electrical chemical plating process (ECP) or an electroless copper plating process. In some embodiments, the thickness of the copper layer 154 is less than 30 µm due to concern of substrate warping described above. In some embodiments, the thickness of copper layer 154 is between about 10 µm to about 20 µm. Afterwards, a diffusion barrier layer 155 is deposited over layer 154. The diffusion barrier layer 155 will eventually receive a solder layer and one or more integrated circuit (IC) chips (to be described below). The diffusion barrier layer 155 prevents copper from layer 154 from diffusing into the IC chips disposed above the TSV substrate. In some embodiments, the diffusion barrier layer 155 is also deposited by plating, such as ECP or electroless plating. In some embodiments, the diffusion barrier layer 155 is made of nickel immersion gold (ENIG). However, any appropriate diffusion barrier material may be used.

Figure 14:
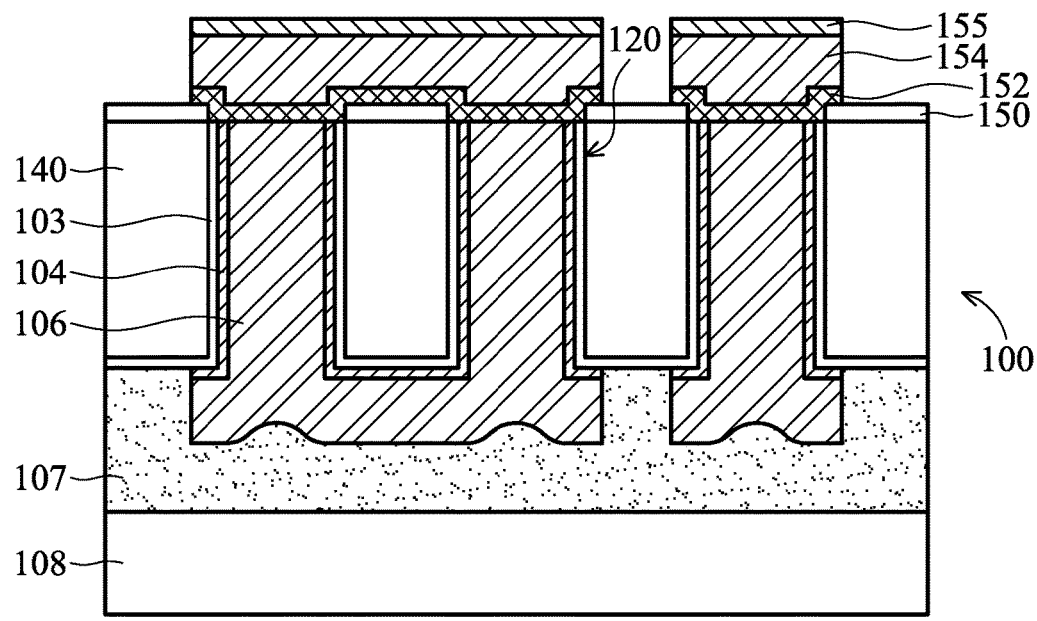

After the deposition of the diffusion barrier layer 155, the photoresist layer 153 and the barrier/Cu-seed layer 152 underneath the photoresist layer 153 are removed. FIG. 14 shows substrate 100 without the photoresist layer 153 and the barrier/Cu-seed layer 152 underneath, in accordance with some embodiments. At this point, the first substrate 100 is prepared to receive the semiconductor chip. Different semiconductor chips could be mounted on the first substrate 100 with slightly different process flows. In some embodiments, the semiconductor chips are light emitting diodes (LEDs) or similar light-emitting devices.

Figure 15:
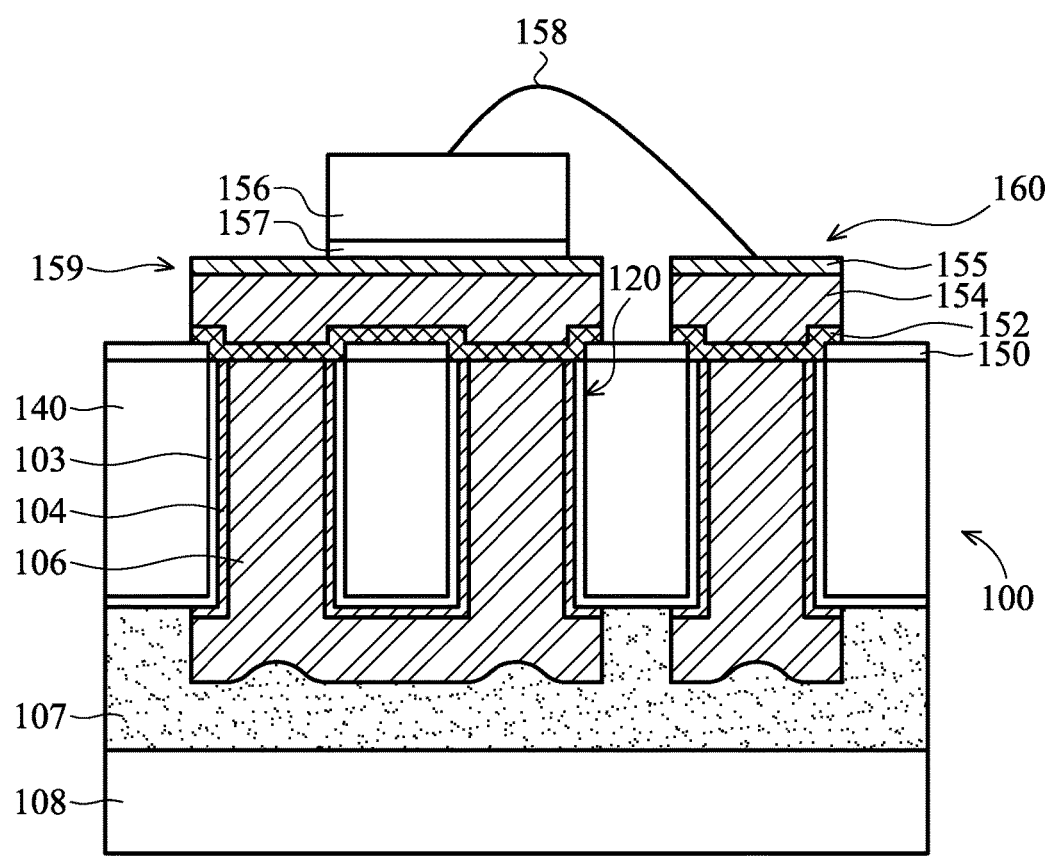

Following the previous operation, a semiconductor chip 156 is secured to the diffusion barrier layer 155 with the help of a eutectic bonding layer 157. In some embodiments, the eutectic bonding layer 157 is made of solder. In the embodiment shown in FIG. 15, the semiconductor chip 156 is a light-emitting diode (LED). The LED chip is placed on P-contact 159, and the LED chip is electrically connected to the N-contact 160 via a wire 158. A wire bonding operation is performed to connect the LED chip 156 to the N-contact 160. FIG. 15 shows the LED chip 156 being placed on the first substrate 100 and bonded to the substrate 100 by the eutectic bonding layer 157 and also being bonded to the N-contact via a wire 158, in accordance with some embodiments. The LED chip 156 is directly placed on the first substrate 100 without a conductive bump because the surface of layer 155 of P-contact 159 is relatively planar.

The copper layer 154 of FIGS. 13-15 provides electrical connection and thermal contact to the semiconductor chip (such as an LED chip) 156 placed on top. The copper layer 154 can also be referred to as a metal pad and does not need to be made of copper. In some embodiments, the metal pad (154) can be made of solder, which can be deposited by a plating process (as described above) or by applying a solder paste over the substrate surface after the photoresist layer 153 is patterned. The solder paste would fill in the openings created by the photoresist layer 153 and leaves very little amount over the photoresist layer 153. The small amount of solder paste over the photoresist layer 153 would have little effect on the removal process of the photoresist layer 153. If solder is used for layer 154 (as a metal pad), the copper seed layer portion of barrier/Cu-seed layer 152 is not needed, in accordance with some embodiments. If the solder layer is plated, a solder seed layer or a seed layer made of non-solder material can be used. However, if the solder layer is pasted on the substrate, a seed layer is not needed.

As shown in FIG. 15, portions of TSVs 120 and layer (or metal pad) 154 extend beyond the edges of the LED chip 156. The extension of electrical and/or thermal connections (such as TSVS 120 and layer 154) of a package substrate (such as substrate 100) beyond the boundary of the semiconductor chip (such as LED 156) can be called fan-out packaging, which provide extra additional area for re-routing and for heat dissipation. The extension of metal layer 154 beyond the edges of LED chip 156 provides horizontal pathways and areas for heat dissipation. The extension of TSVs 120 beyond the edges of LED chip 156 provides room for additional TSVs 120 to provide vertical paths and areas for heat dissipation. Both the horizontal and vertical pathways and areas affect and improve the efficiency of heat dissipation.

Figure 16:
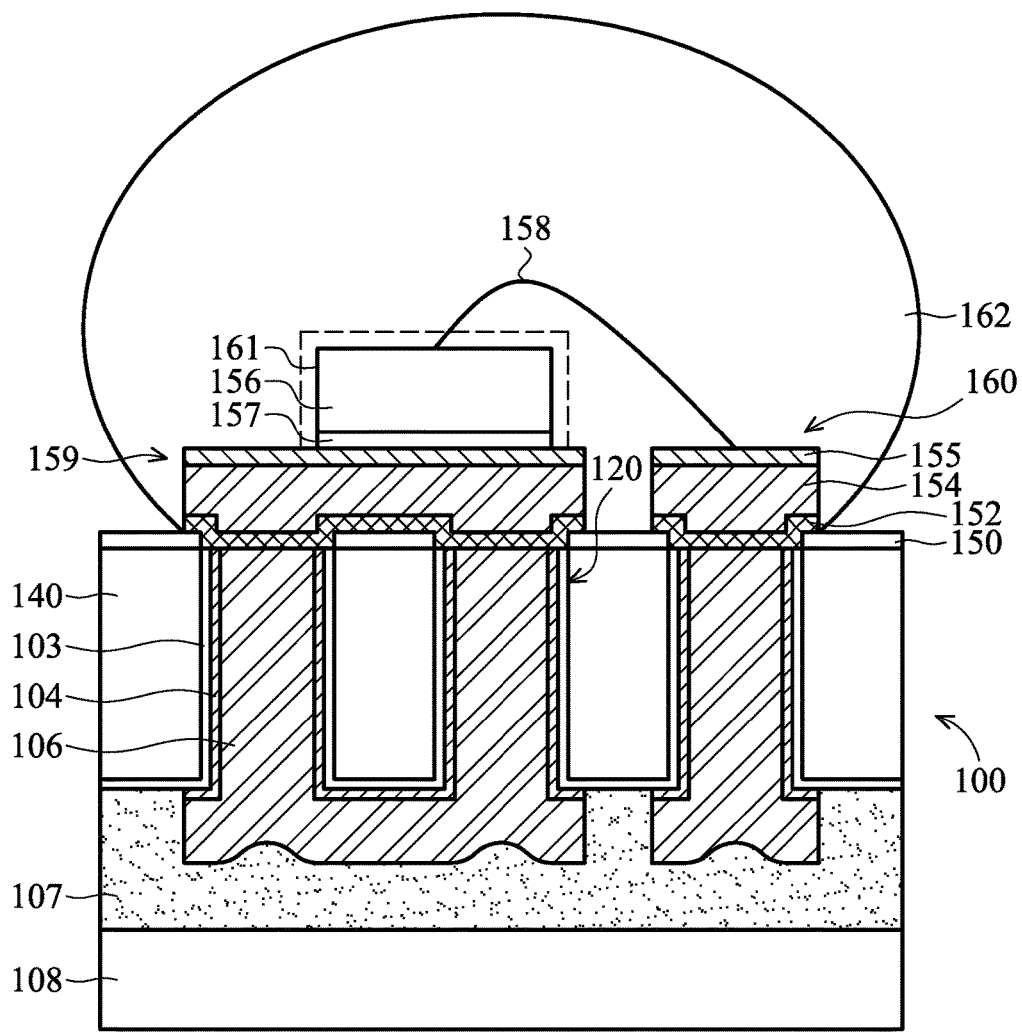

After the LED chip 156 is bonded to the substrate and wire bonded, the LED chip 156 is packaged, as shown in FIG. 16 in accordance with some embodiments. In some embodiments, a layer of phosphorus film 161 is deposited on the LED chip 156. An LED chip is designed to emit red, blue, or green light. LED chips emitting red, blue and green light are often placed together in order to create white light. Phosphorous film can also be used to generate white light. In some embodiments, the phosphorus film 161 is coated on the LED chip 156. However, coating of the phosphorous film 161 is optional. In some embodiments, different phosphorus films are coated on LEDs with different colors (or different emitted wavelengths). In some other embodiments, a phosphorous film, such as film 161, is not needed.

Afterwards, a molding material 162 is deposited to surround the LED chip 156, the P-contact 159, and the N-contact 160. In some embodiments, the molding is made of a transparent epoxy resin. Transparent molding material is relevant to LEDs. If the semiconductor chip is not an LED, the molding does not need to be transparent.

Figure 17:
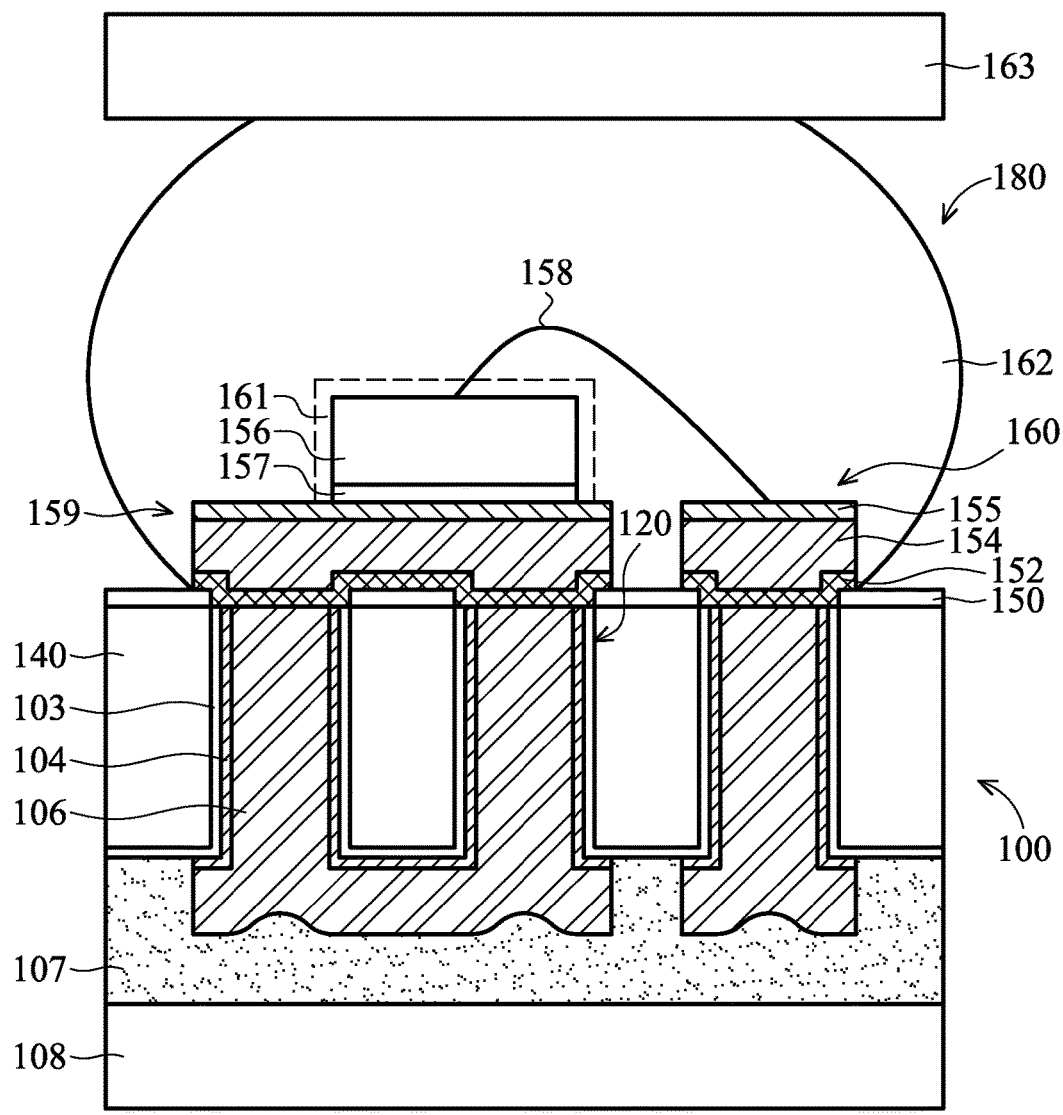
Figure 18:
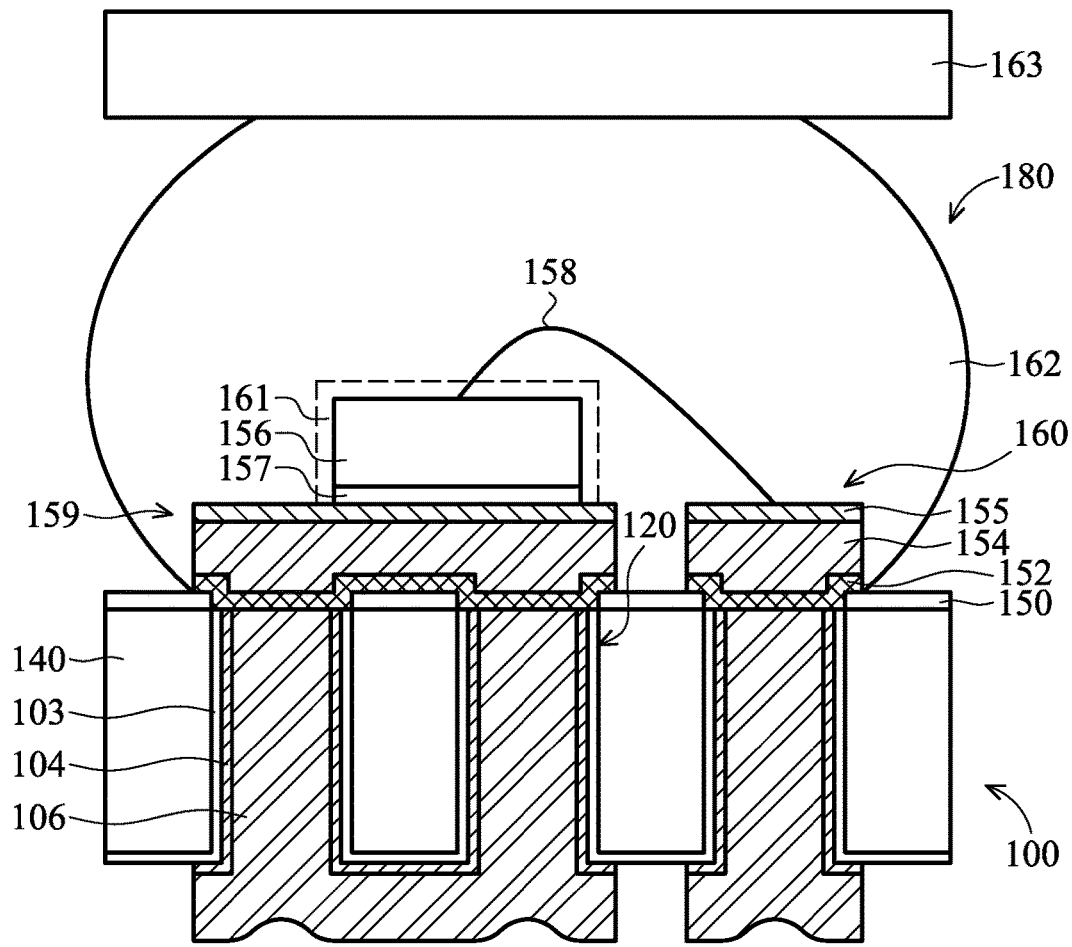

FIG. 17 shows the side of molded LED chip 156 is placed on an adhesive tape 163, in accordance with some embodiments. The adhesive tape (sometimes called blue tape) 163 securely supports the molding 162 of the LED chip 156 and the first substrate 100 in preparation of detaching (or debonding) the second substrate 108. After the second substrate 108 and the glue layer 107 are chemically and mechanically removed, the first substrate 100 is sawed to physically separate dies on the first substrate 100, with each die having an LED chip 156, N-contact 160 and P-contact 159. FIG. 18 shows the dummy substrate 108 and glue layer 107 having been removed and the adhesive tape 163 holding a single packaged chip 180, in accordance with some embodiments. Other processing operations, such as placing packaged chip 180 on a PCB, removing adhesive tape layer 163 etc., may follow afterwards.

The exemplary process flow described above shows how semiconductor chips could be packaged with a substrate with through silicon vias to improve heat dissipation. Further, the heat dissipation of the packaged chip described above is superior to other through silicon via technologies because the thickness of the silicon substrate has been thinned to between about 20 µm to about 200 µm.

As mentioned above, the chip packaging method and structures described above can be used for semiconductor chips that are not LEDs. When the packaging methods and structures are used for non-LED chips, the process flows could be different in some portions, especially the process operations after an LED is used (i.e., after FIG. 15).

Figure 19A:
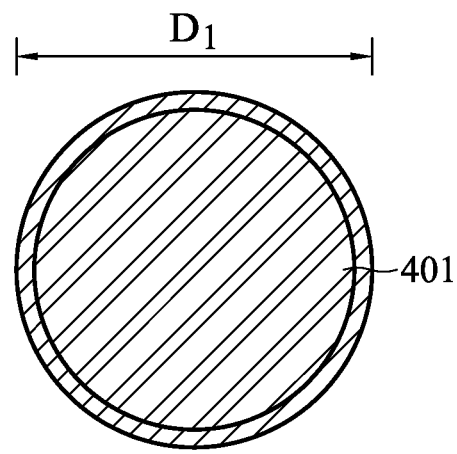
FIGS. 19A-19E show top views of various designs of through silicon plugs (TSPs), in accordance with some embodiments.

Through silicon plugs (or vias, or trenches) under the semiconductor chips could be in various shapes and dimensions. For example, the through silicon vias can be in the shape of cylinders. FIG. 19A shows a top view of a TSP (or TSV) 401 (a cylinder), in accordance with some embodiments. The diameter of the TSP 401 is D1. As mentioned above, D1 may be in the range between about 5 µm to about 100 µm. For small chips with about the same surface areas (or top surface areas) as the surface of TSP 401, a single TSP, such as TSP 401, can be used. However, often the semiconductor chips have surface area (or top surface area) much larger than the surface area of a single TSP. For example, the surface area of an LED chip can be 0.6×0.6 mm$^2$, 1×1 mm$^2$, or larger. These numbers are merely exemplary. In addition, the top surface of the semiconductor chip does not have to be in square shape. The top surface can be in rectangular shape or in other shapes.

Figure 19B:
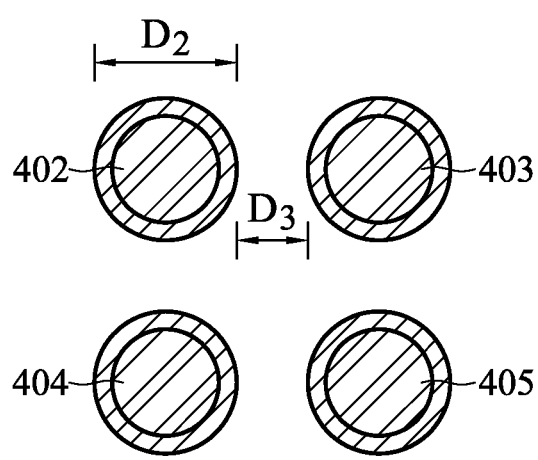

A TSP cannot be made too large (or with a cross section that is too large) to avoid extensive gap-filling time and other issues. FIG. 19B shows an embodiment of TSPs (or TSVs) with multiple TSPs, such as 402, 403, 404, and 405, to provide thermal dissipation for the semiconductor chip disposed over the TSPs. FIG. 19B only shows 4 TSPs. However, there could be more than 4 TSPs or less than 4 TSPs (such as 2 or 3). In some embodiments, the diameter D2 for each TSP in FIG. 19B is between about 5 µm to about 100 µm. D3 is the smallest distance between two TSPs in FIG. 19B. In some embodiments, D3 is equal to or larger than D2. Sufficient distance is needed between the neighboring TSPs to ensure good electrical isolation and to provide structural strength. As mentioned above in the process flow, the substrate undergoes mechanical process(es), such as backside grinding and sometimes chemical-mechanical polishing, which exerts large amounts of stress on the substrate. Without sufficient structural support of the dielectric layer between TSPs, the substrate can crack and/or the substrate layers with the TSPs can crack or pill.

Figure 19C:
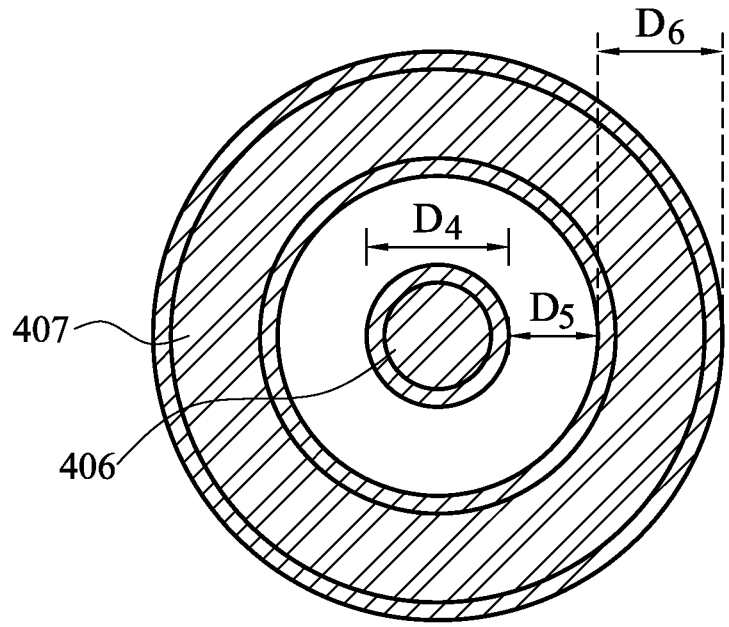

In some embodiments, the TSPs (or TSVs) can be in the configuration of concentric rings with a central cylinder, as shown in FIG. 19C. There could be one or more concentric rings. FIG. 19C shows one concentric ring 407, surrounding a central cylinder 406. In some embodiments, the diameters D4 for TSV 406 and width D6 of TSP 407 are between about 5 µm to about 100 µm. In some embodiments, the distance between the TSPs, D5, is equal to or larger than either D4 or D6. As mentioned above, sufficient support from the insulating layer(s) is needed.

Figure 19D:
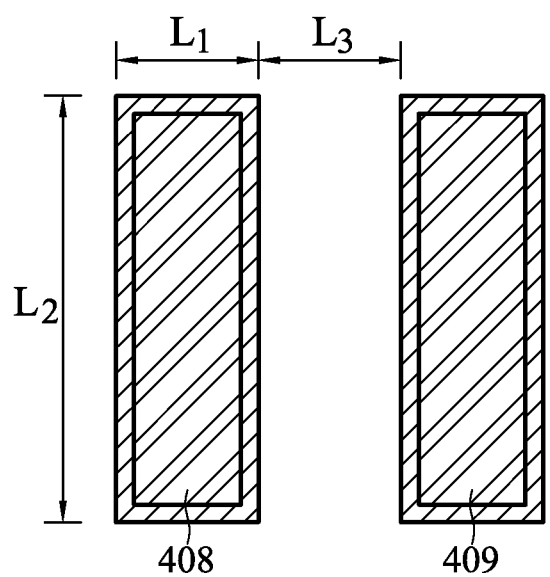

TSPs do not need to be in circular shapes. They can be in other types of shapes, such as triangular, square, rectangular, oval, hexagonal, etc. FIG. 19D shows a number of rectangular TSPs, such as TSPs 408 and 409, in accordance with some embodiments. The rectangular TSPs (or through silicon trenches) 408 and 409 both have a width L1 and with a length L2, and are separated by a distance L3. In some embodiments, the width L1 is between about 5 µm to about 100 µm. In some embodiments, the distance between the TSPs, L3, is equal to or larger than L1. The number of rectangular-shaped TSPs could be one or more.

Figure 19E:
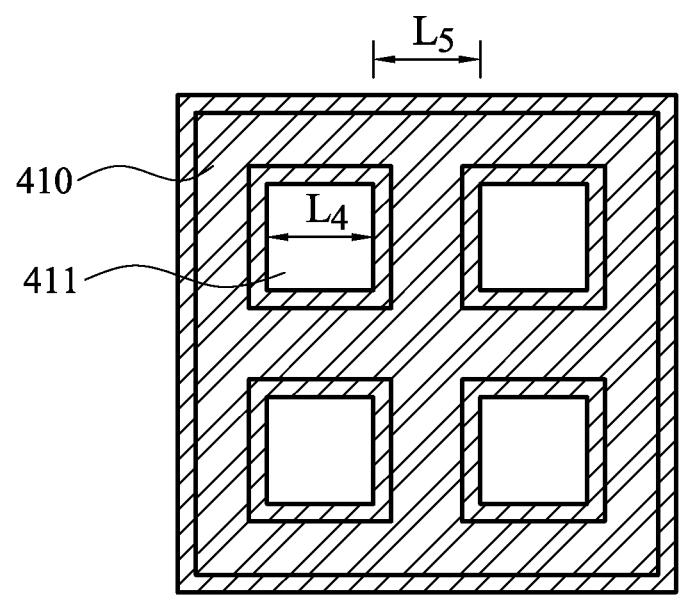

In some embodiments, the TSPs could be a pattern, as shown in FIG. 19E. FIG. 19E shows that a patterned TSP 410 having a number of openings, such as opening 411, inside the pattern. The openings 411 in FIG. 19E are square-shaped (cross-section). However, the openings can be rectangular columns, circular cylinders, or other shapes of columns. In some embodiments, the distance between the openings 411 is L5, which is equal to or smaller than the width of the opening L4.

Figure 20A:
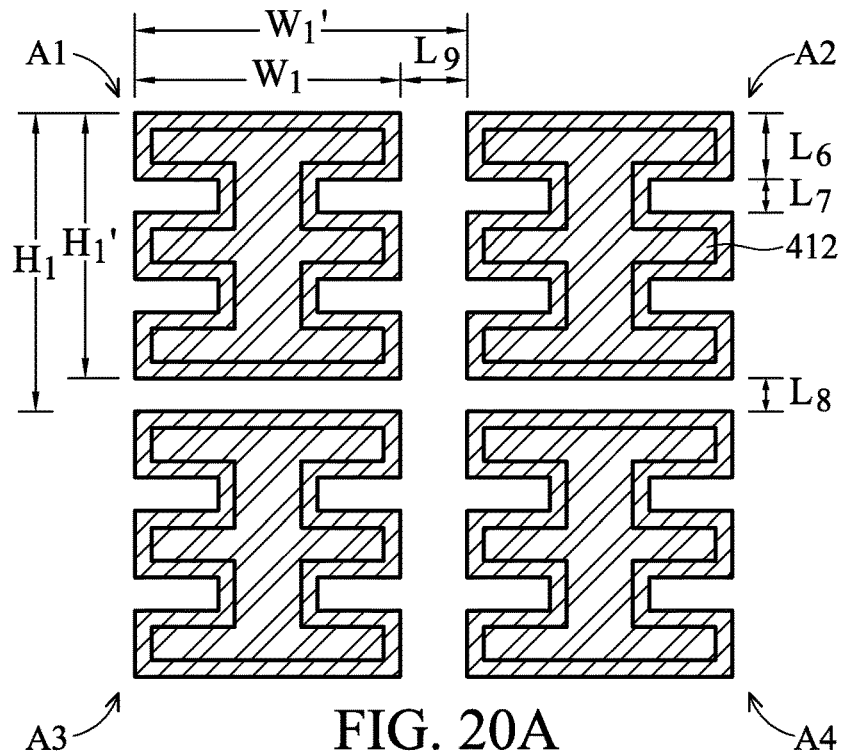
FIGS. 20A-20B show top views of two designs of through silicon plugs (TSPs), in accordance with some embodiments.
Figure 20B:
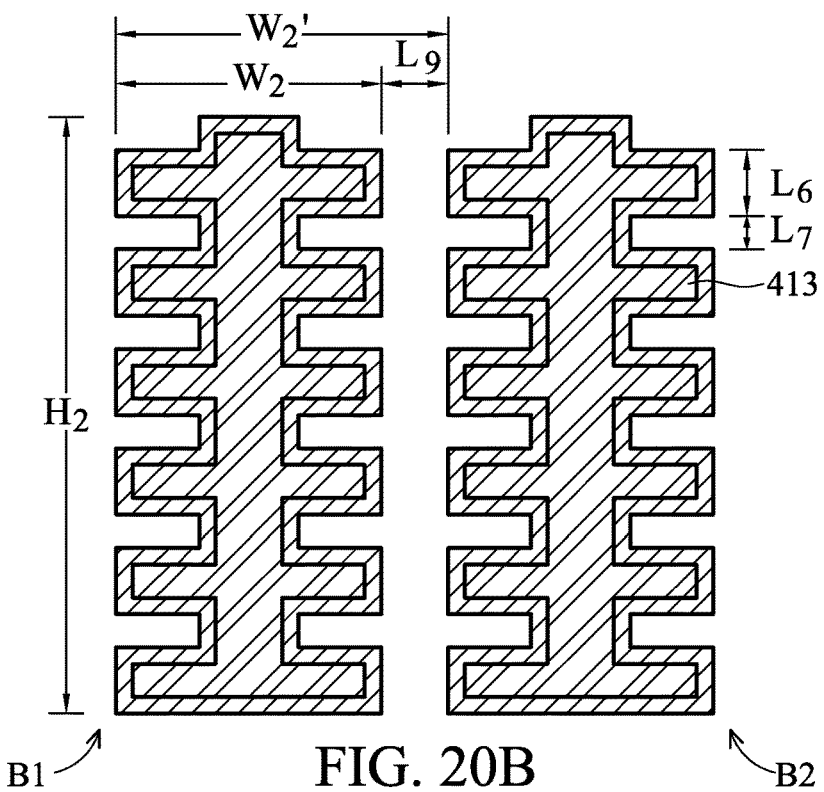

FIGS. 20A and 20B show two other different configurations of TSPs, in accordance with some embodiments. The configurations in FIGS. 20A and 20B are similar, in some embodiments. The TSPs in FIGS. 20A and 20B are shaped liked doubled-sided combs. The double-sided combs of TSPs in FIG. 20B are longer than the combs TSPs of FIG. 20A. The widths of TSPs in FIGS. 20A and 20B are both L6, which is between about 5 µm to about 100 µm in some embodiments. The spaces L7, L8 and L9 between combs in FIGS. 20A and 20B are equal to or greater than L6, and also between about 5 µm to about 100 µm in some embodiments. The width and height of one of the TSP structures in FIG. 20A, such as structure A1, are W1 (width) and H1 (height) respectively. The width and height together with the spaces between structures of structure A1 of FIG. 20A are W1' and H1' respectively. The width and height of the one of the TSP structure in FIG. 20B, such as structure B1, are W2 (width) and H2 (height) respectively. The width together with the space between structures of structure A1 of FIG. 20A is W2'. The number of combs on one side of structure A1 is 3. However, the number can be any number, such as 1, 2, . . . to N. N is an integer number, which can be 10 or higher. The number of combs on one side of structure B1 is as high as needed to expand the entire width or length of a semiconductor chip, such as an LED chip 156, placed over the TSP substrate, such as substrate 100. In some embodiments, the A1 or B1 TSP structures of FIGS. 20A and 20B are repeated to cover the entire width and length of the semiconductor chip. In some embodiments, the A1 or B1 TSP structures of FIGS. 20A and 20B are repeated to cover the entire width and length of the semiconductor chip and extends beyond the entire width and length of the semiconductor chip (i.e. TSP area of package substrate is larger than the semiconductor chip). The width and height of TSP structures can be designed to be best suited to the semiconductor chips to provide sufficient heat dissipation.

The TSPs 412 of FIG. 20A and TSPs 413 of FIG. 20B have patterns that allow large cross-sectional areas of TSPs. Yet the TSPs of FIGS. 20A and 20B are not made of one large TSP, such as TSP 401 of FIG. 19A. Such patterns prevent manufacturing issues, such as long plating time, weak structural support and others. The large cross-sectional areas provide large amount of heat transfer pathways and areas. As mentioned above, some semiconductor chips, such as LED chips, generate a large amount of heat that needs to be dissipated. A substrate with large cross-sectional areas of TSPs is useful in providing a large amount of heat transfer pathways. Duty ratio is used to quantify the amount of heat dissipation pathways of a package with TSPs. Duty ratio is defined as conductive areas (cross-sections of TSPs) divided by the total chip (placed above the conductive areas, such as an LED chip) cross-sectional area, as shown below in equation (1).

$$\text{Duty Ratio} = \text{Conductive Areas/Total Chip Cross-Sectional Area} \qquad \text{Eq. (1)}$$

A semiconductor package (or substrate) with a high duty ratio can provide a higher rate of heat dissipation compared to a package with a lower duty ratio. The embodiments of TSP configurations in FIGS. 20A and 20B show 4 separate TSP structures A1, A2, A3, A4 in FIG. 20A and 2 separate TSP structures B1, B2 in FIG. 20B. If the widths and spaces of TSP combs are the same in FIGS. 20A and 20B, the TSP configuration in FIG. 20B has a higher duty ratio than the configuration in FIG. 20A. The configuration in FIG. 20A has additional spaces between structures A1 and A3 and between structures A2 and A4, in comparison to the configuration in FIG. 20B. Therefore, the duty ratio of the configuration in FIG. 20A is lower than that of FIG. 20B. If the widths and spaces of TSP combs in FIG. 20B are the same (L6=L7=L9), the percentage of TSPs cross-sectional areas to the total cross-sectional area can be 50% or higher. If the TSP structures extend beyond the edges of the semiconductor chip (fan-out packaging), the duty ratio would be greater than 50%.

Figure 21A:
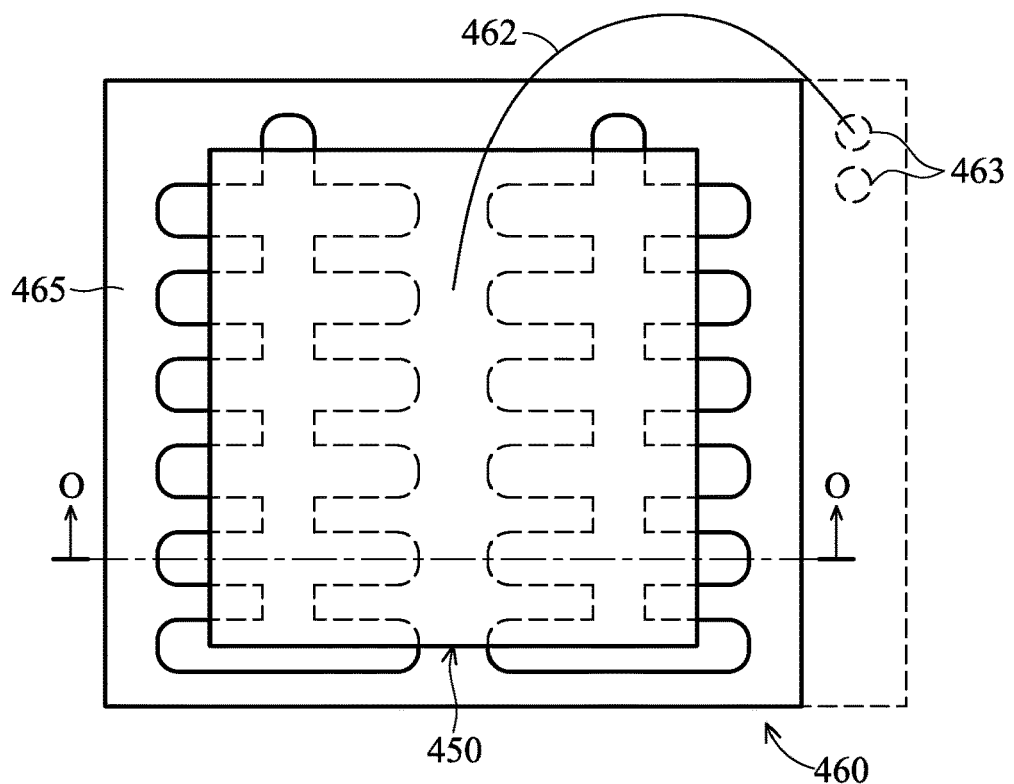
FIG. 21A shows a top view of a semiconductor chip over a package substrate, in accordance with some embodiments.

FIG. 21A shows a top view of a semiconductor chip 450 placed on top of a package substrate 460, in accordance with some embodiments. The TSP structures of the package substrate 460 extend beyond the width and length of semiconductor chip 450. The duty ratio of the packaged chip as shown in FIG. 21A is greater than 50%. FIG. 21A also shows a number of TSPs 463 that are part of an N-contact, if the semiconductor chip 450 is an LED chip, in accordance with some embodiments. Under this circumstance, the LED chip 450 is placed on a P-contact and is wired to the N-contact through a wire 462, in some embodiments.

Figure 21B:
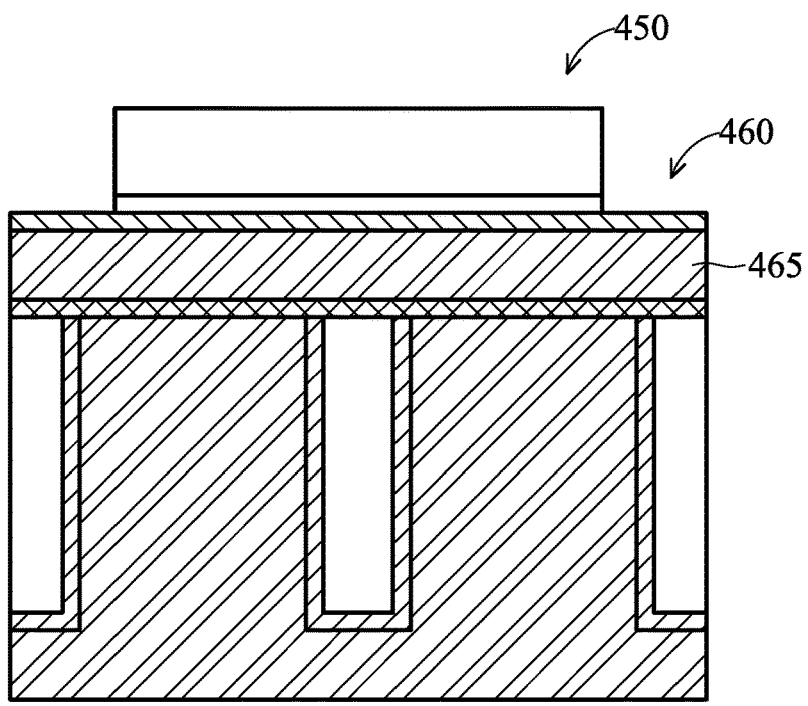
FIG. 21B shows a side view of FIG. 12A, in accordance with some embodiments.

As described above, there could be a metal layer, such as layer 154 of FIGS. 15-18, which provide connection between the semiconductor chip and the TSP structures. The extended area 465 of the metal layer outside the semiconductor chip 450 provides lateral heat dissipation pathways for the semiconductor chip 450. FIG. 21B shows a side view of FIG. 21A cut along line OO. The TSPs of substrate 460 provides vertical heat dissipation pathways.

Figure 22:
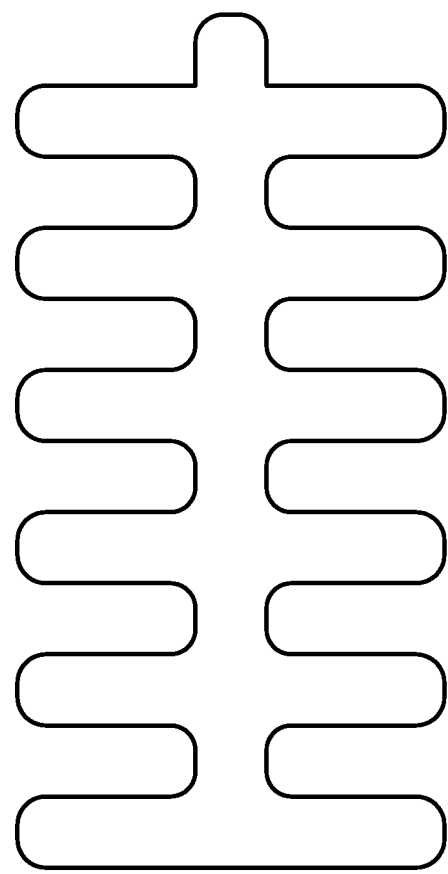
FIG. 22 shows the design of FIG. 20B with rounded corners, in accordance with some embodiments.
Figure 23A:
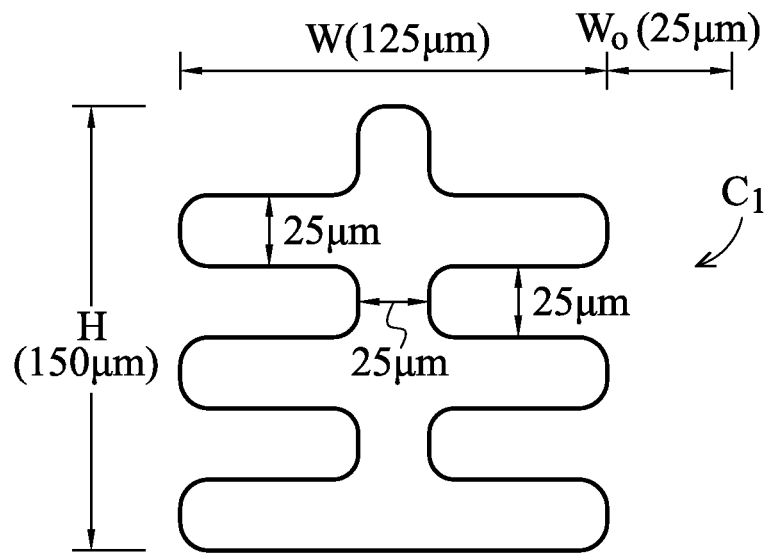
FIGS. 23A-24B show various designs of TSPs on package substrates, in accordance with some embodiments.
Figure 23B:
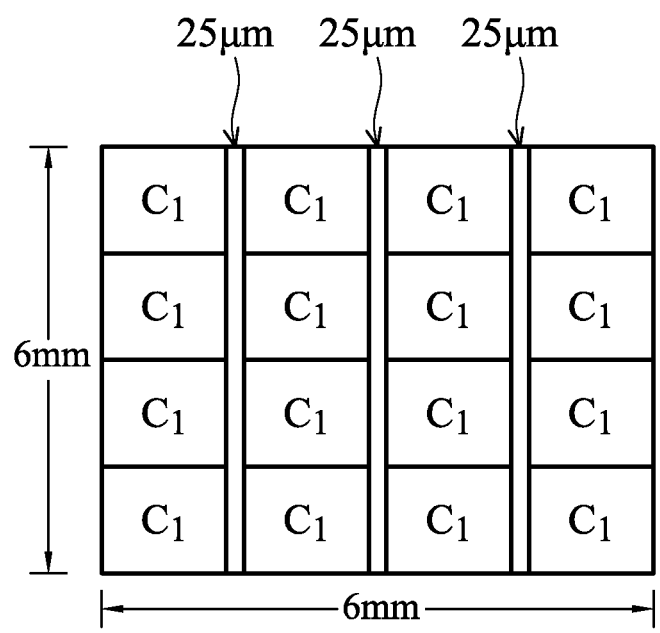

The TSP structures in FIGS. 19D and 19E, and FIGS. 20A and 20B all have rigid corners. During substrate processing, the patterning process can make the corners rounded. FIG. 22 shows structure B1 of FIG. 20B with corners rounded. The rounded B1 structure in FIG. 22 is formed by placing two unit structures C1, as shown in FIG. 23A, together, in accordance with some embodiments. In some embodiments, the length H of the unit structure C1 is about 150 µm and the width is about 125 The width and space of TSP structures in C1 are both about 25 µm, in some embodiments. For a semiconductor chip, such as an LED chip, that is about 0.6 mm by about 0.6 mm (or 0.6×0.6 mm²), 16 C1 structures can be put together in a 4×4 fashion to fill the area under the semiconductor chip. The width of the C1 unit is about 125 µm, because, there is a space about 25 µm between two C1 units. FIG. 23B shows 16 C1 structures fill an area of 0.6 mm×0.6 mm of a package substrate to dissipate heat for a semiconductor chip that is about 0.6×0.6 mm². Between the C1 structures, there are spaces, which have a width about 25 µm.

Figure 23C:
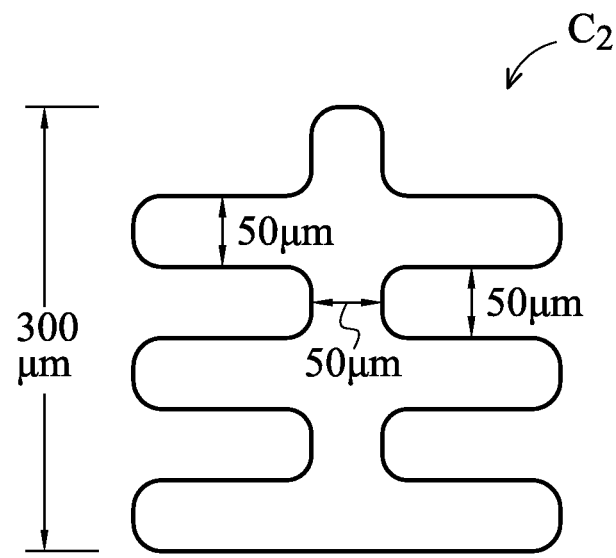
Figure 23D:
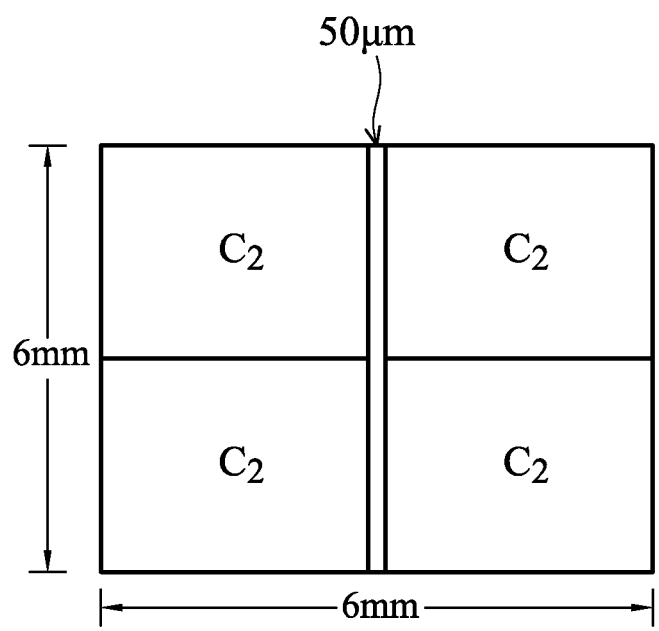

FIG. 23C shows a C2 structure, which is similar to the C1 structure of FIG. 23A, whose length is about 300 µm and the width is about 250 µm in accordance with some embodiments. The width and space of TSP structures in C2 are both about 50 µm, in some embodiments. Four C2 structures can be used to fill an area about 0.6×0.6 mm2. FIG. 23D shows the arrangement of 4 C2 unit structures. Between the C2 structures, there are spaces, which have a width about 50 µm. In some embodiments, each of the double-sided combs, such as structures C1, C2, and C3, has a width of between about 100 µm to about 300 µm. In some embodiments, each of the double-sided combs, such as structures C1, C2, and C3, has a length of between about 100 µm to about 300 µm.

Figure 23E:
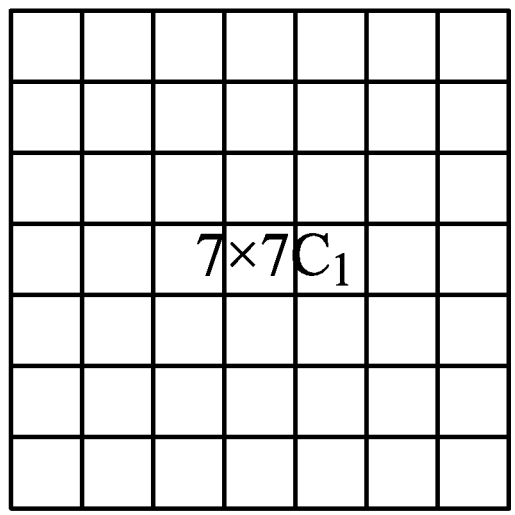
Figure 23F:
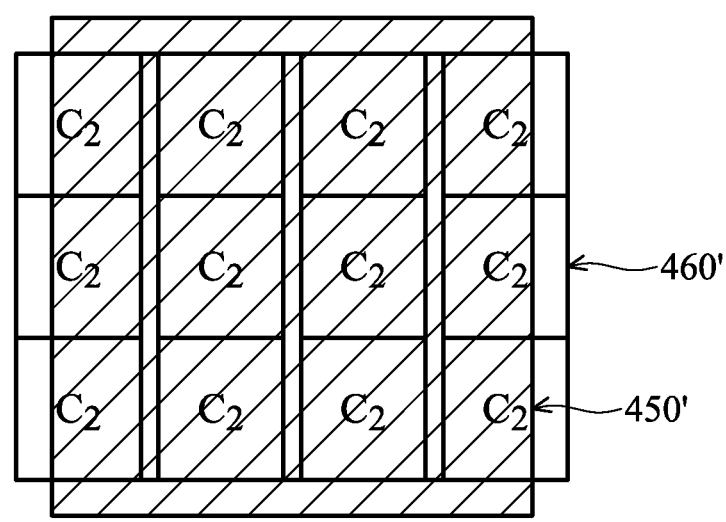
Figure 24A:
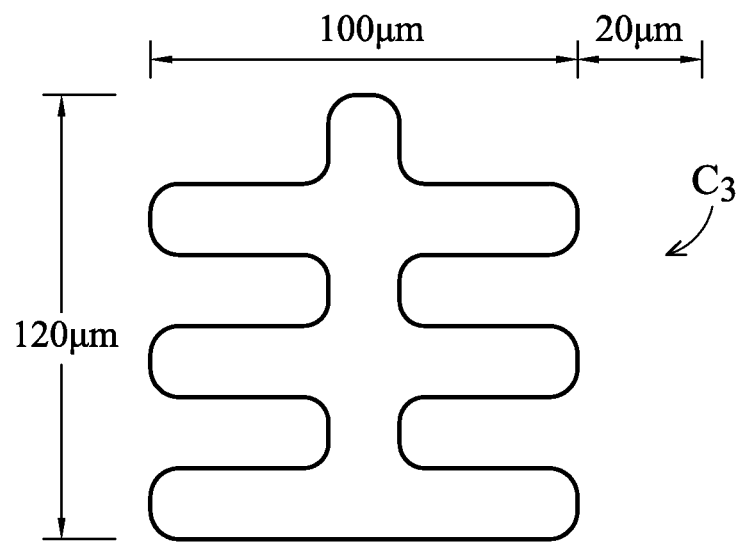
Figure 24B:
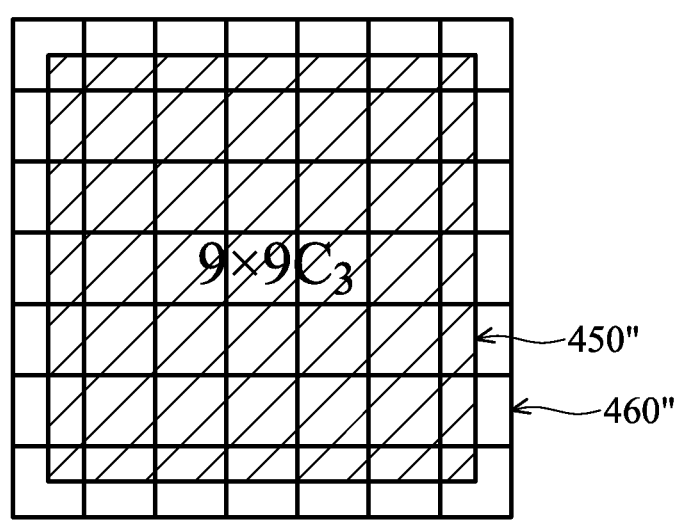

For semiconductor chips that are larger, additional TSP unit structures can be added into the design of TSP configuration (or structures) to provide high duty ratio for heat dissipation. In some embodiments, the semiconductor chip has a dimension of about 1×1 mm². For such semiconductor chips, an arrangement of 7×7 C1 chips would cover most of the areas under the chip, as shown in FIG. 23E, in some embodiments. In other embodiments, 4×3 C2 chips can cover the majority of area under a 1×1 mm² chip. FIG. 23F shows 4×3 C2 TSP units arranged on a substrate 460', which is under a 1×1 mm² semiconductor chip 450'. In addition to the exemplary unit structures shown in FIGS. 23A and 23C, other structures are also possible. FIG. 24A shows a TSP unit structure C3, which is similar to structure C1 and structure C2, in accordance with some embodiments. Unit structure has a height of about 120 µm and a width of about 100 µm. The width and space of the comb structures are both about 20 µm. In some embodiments, 9×9 of C3 TSP structures are designed in the package substrate to cover the entire surface area of a 1×1 mm² semiconductor chip. FIG. 24B shows the arrangement of the C3 structures of a package substrate 460" and the 1×1 mm² semiconductor chip, in accordance with some embodiments.

Figure 25A:
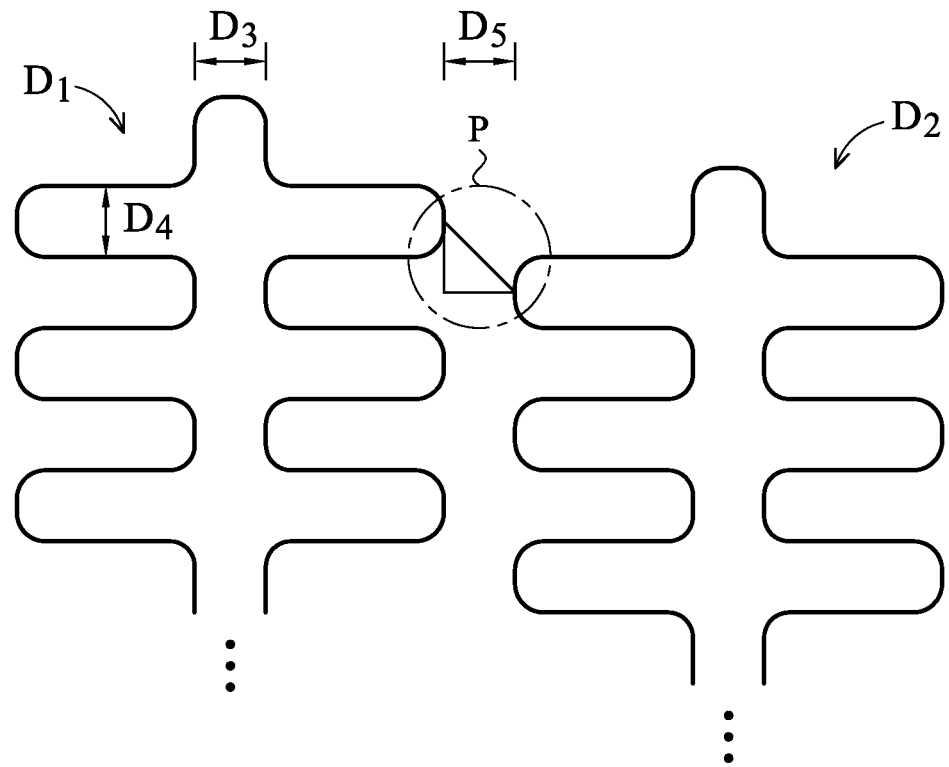
FIGS. 25A-25B show a design of TSPs with double-sided combs, in accordance with some embodiments.
Figure 25B:
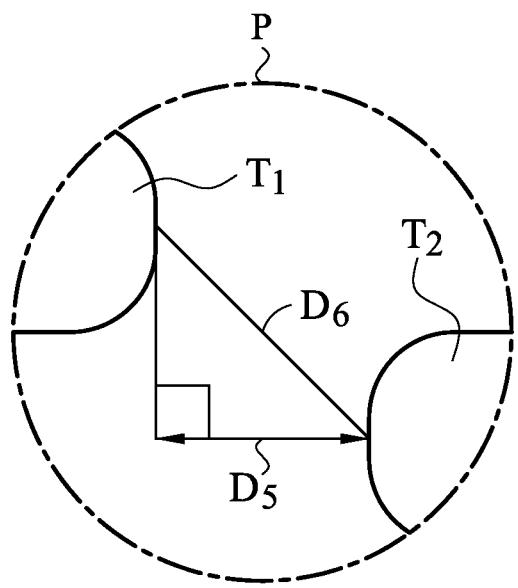

The doubled-sized-comb structures of TSPs described above in FIGS. 20A, 20B, 21A, 23B, 23D, 23E, 23F, and 24B are all placed side by sized with tips of combs pointing to one another. In some embodiments, the tips of combs can be staggered, as shown in FIG. 25A. Comb D1 and comb D2 of FIG. 25A have their tips not pointed directly to one another. Instead, combs D1 and D2 are staggered and tips are off-set from one another. Region P of FIG. 25A is expanded in FIG. 25B, which shows that tip T1 of comb D1 is not in the same horizontal line with tip T2 of comb D2. As mentioned above the first width D3 of the combs is about equal to the second width D4 of combs, in some embodiments. As described above, in FIGS. 20A, 20B, 23A, 23B, 23C, 23D, 23E, 23F, 24A, and 24B, the space D5 between two separate combs is roughly equal to the widths D3, D4, of the combs, in some embodiments. Sufficient spacing between combs provides structural support for the TSPs. However, due to the staggered nature of combs D1 and D2, the distance between two neighboring and separate combs is D6, which is about 1.41×D5. If D6=D3=D4, D5 can be smaller than D3 and D4 and can be about 0.71×D3 (or D4). With a smaller D5 (than D3 or D4), the combs can be packed tighter. The reduced spacing between independent and neighboring combs can increase the duty ratios of package substrates.

Although it is desirable to have the package substrate with TSP structures larger than the semiconductor chip to increase the duty ratio, such as to be greater than 50%, the TSP structures occupy space and would undesirably increase the substrate area used to package the semiconductor chip. In addition to increased package size, larger TSP areas also require more metal to gap fill the TSP structure and would increase manufacturing cost. In some embodiments, the duty ratio is kept equal to or below than 65%.

In the discussion above, it was stressed that the duty ratio for a package substrate for a semiconductor chip that release large amount of heat, such as an LED chip, should be as high as possible. However, sometimes the duty ratio less than 50%, such as 20-30%, is sufficient to dissipate heat generated by the semiconductor chip. In some embodiments, the duty ratio of the TSPs is equal to or greater than about 30%. The requirement of duty ratio depends on the type of semiconductor chip to be packaged.

As mentioned above, the semiconductor chip could an LED chip, in accordance with some embodiments. An LED chip can include numerous LEDs. A single LED can generate red, yellow or blue light. To enable generating white light, three or multiple of three LEDs are needed.

The structures and patterns of TSPs described and shown above are merely examples, the shapes, patterns and arrangements of TSVs or TSPs that are not mentioned here, or are variations of the structures mentioned above are also possible. The embodiments of through silicon plugs (TSPs) with different patterns described above can be used under one or more semiconductor chip(s) to improve heat dissipation and can be made with manageable manufacturing concerns, such as long copper plating time and structural strength.

The package substrates with through silicon plugs (or vias) described above provide lateral and vertical heat dissipation pathways for semiconductor chips that require thermal management. Designs of through silicon plugs (TSPs) with high duty ratios can most effectively provide heat dissipation. TSP designs with patterns of double-sided combs can provide high duty ratios, such as equal to or greater than 50%. Package substrates with high duty ratios are useful for semiconductor chips that generate large amount of heat. An example of such semiconductor chip is a light-emitting diode (LED) chip.

One aspect of this description relates to a method of making a semiconductor device. The method includes forming a first opening and a second opening in a substrate. The method further includes forming a conductive material in the first opening and in the second opening, the conductive material comprising a joined portion where the conductive material in the first opening and the conductive material in the second opening are electrically and thermally connected together at a first surface of the substrate. The method further includes reducing a thickness of the substrate from a second surface of the substrate, opposite the first surface, to expose the conductive material in the first opening and the conductive material in the second opening. The method further includes connecting a device to the second surface of the substrate.

Another aspect of this description relates to a method of making a semiconductor device. The method includes etching a substrate to form a first opening and a second opening and forming an isolation layer in the first opening and the second opening, the isolation layer having a higher thermal resistance that the substrate. The method further includes forming a conductive material in the first opening and in the second opening, wherein the isolation layer is located between conductive material and the substrate. The method further includes forming a metal pad over a first surface of the substrate, wherein the metal pad is electrically and thermally connected to the conductive material in the first opening and the conductive material in the second opening. The method further includes bonding a device to the metal pad, wherein the metal pad is electrically and thermally connected to the device.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A semiconductor structure, comprising:
a chip; and
a substrate connected to the chip, wherein the substrate is configured with through silicon plugs (TSPs) in the substrate, wherein the TSPs extend from a first surface of the substrate to a second surface opposite to the first surface, wherein a cross-section of the TSPs show a pattern of double-sided combs, the pattern of the double-sided combs including at least two TSPs contiguously connected by a conductive material disposed within a material of the substrate.

2. The semiconductor structure of claim 1, wherein the chip is a light-emitting diode (LED) chip.

3. The semiconductor structure of claim 1, wherein the pattern of double-sided combs comprises two or more sub-structures of double-sided combs.

4. The semiconductor structure of claim 1, wherein there is a metal layer between the chip and the TSPs.

5. The semiconductor structure of claim 1, wherein the TSPs are filled with copper.

6. The semiconductor structure of claim 1, wherein the chip is an LED chip and the TSPs are included in a P-contact for the chip, and wherein the semiconductor structure contains additional TSPs, wherein the additional TSPs are included in an N-contact for the chip.

7. The semiconductor structure of claim 1, wherein the pattern of double-sided combs is formed by a number of sub-structures of doubled-side combs, and wherein the number is selected from a group consisting of 4, 16, 49, 12, or 81.

8. The semiconductor structure of claim 1, wherein two neighboring double-sided combs of the pattern of double-sided combs are placed in a staggered pattern.

9. The semiconductor structure of claim 1, wherein conductive material disposed within the material of the substrate includes the conductive material extending along the second surface of the substrate.

10. The semiconductor structure of claim 9, wherein a bond pad is disposed over the first surface of the substrate, the chip disposed on the bond pad.

11. A semiconductor structure, comprising:
a substrate with through silicon plugs (TSPs) on the substrate, wherein the TSPs extend from a first surface of the substrate to a second surface opposite to the first surface, and a cross-section of the TSPs include a pattern of double-sided combs, the double-sided combs having at least two TSPs contiguously connected by a conductive material disposed included in the TSPs and extending over the first surface of the substrate; and
a bond pad disposed over the second surface of the substrate connected to the at least two TSPs; and
a chip disposed over the bond pad.

12. The semiconductor structure of claim 11, wherein the chip is a light-emitting diode (LED) chip.

13. The semiconductor structure of claim 12, wherein the LED chip is connected to another bond pad disposed over the second surface of the substrate.

14. The semiconductor structure of claim 13, wherein the LED chip is connected to the another bond pad by a wire.

15. The semiconductor structure of claim 13, wherein the bond pad and the another bond pad are separated by a space.

16. The semiconductor structure of claim 15, wherein the space includes a molding material.

17. A semiconductor structure, comprising:
a substrate having a plurality of conductive plugs including a first conductive plug, a second conductive plug and a third conductive plug, wherein each of the first, second and third conductive plugs extend from a first surface to a second surface of the substrate, wherein the plurality of conductive plugs are configured to form a double-sided comb structure in a cross-section;
a conductive material included in the first and second conductive plugs contiguously extending from the first conductive plug to the second conductive plug;
a first bonding pad disposed over and connected to each of the first and second conductive plugs;
a second bonding pad disposed over and connected to the third conductive plug, wherein the second bonding pad is spaced a distance from the first bonding pad; and
a device disposed over the first bonding pad.

18. The semiconductor structure of claim 17, wherein the conductive material includes at least one of a copper layer, a barrier layer, or a copper seed layer.

19. The semiconductor structure of claim 17, wherein the conductive material extends from the first conductive plug to the second conductive plug adjacent the second surface.

20. The semiconductor structure of claim 17, wherein a molding material is in the distance between the first bonding pad and the second bonding pad.

* * * * *